(12) United States Patent
Iwata

(10) Patent No.: US 7,612,634 B2
(45) Date of Patent: Nov. 3, 2009

(54) HIGH FREQUENCY MODULE UTILIZING A PLURALITY OF PARALLEL SIGNAL PATHS

(75) Inventor: Masashi Iwata, Tokyo (JP)

(73) Assignee: TDK Corporation, Tokyo (JP)

( * ) Notice: Subject to any disclaimer, the term of this patent is extended or adjusted under 35 U.S.C. 154(b) by 266 days.

(21) Appl. No.: 11/723,359

(22) Filed: Mar. 19, 2007

(65) Prior Publication Data

US 2007/0229189 A1    Oct. 4, 2007

(30) Foreign Application Priority Data

Mar. 31, 2006    (JP) .............................. 2006-099064

(51) Int. Cl.
*H03H 9/70*    (2006.01)
(52) U.S. Cl. ...................... 333/133; 333/132; 333/129; 455/78
(58) Field of Classification Search ................. 333/133, 333/129, 132; 455/78, 83
See application file for complete search history.

(56) References Cited

U.S. PATENT DOCUMENTS

| 5,621,366 | A | * | 4/1997 | Gu et al. ...................... 333/204 |
| 6,600,385 | B2 | | 7/2003 | Harada et al. |
| 6,750,737 | B2 | * | 6/2004 | Uriu et al. .................... 333/133 |
| 6,771,144 | B2 | * | 8/2004 | Takamine ..................... 333/133 |
| 6,876,273 | B2 | | 4/2005 | Harada et al. |
| 6,882,250 | B2 | * | 4/2005 | Uriu et al. .................... 333/193 |
| 6,906,411 | B1 | | 6/2005 | Katsura et al. |
| 2004/0032706 | A1 | * | 2/2004 | Kemmochi et al. ...... 361/306.3 |
| 2006/0044080 | A1 | * | 3/2006 | Hagiwara et al. ........... 333/195 |

FOREIGN PATENT DOCUMENTS

| EP | 0 978 896 A2 | * | 2/2000 |
| JP | A 2000-059113 | | 2/2000 |
| JP | A-2001-345419 | | 12/2001 |
| JP | A 2002-101005 | | 4/2002 |
| JP | A 2002-217656 | | 8/2002 |
| JP | A 2002-344347 | | 11/2002 |
| JP | A-2003-142981 | | 5/2003 |
| JP | A 2005-020154 | | 1/2005 |
| JP | A 2005-192241 | | 7/2005 |
| JP | A-2005-260837 | | 9/2005 |
| JP | A-2005-268985 | | 9/2005 |
| JP | A-2005-311929 | | 11/2005 |
| JP | A 2005-333675 | | 12/2005 |
| WO | WO 02/01931 A1 | | 1/2002 |

* cited by examiner

*Primary Examiner*—Barbara Summons
(74) *Attorney, Agent, or Firm*—Oliff & Berridge, PLC

(57) ABSTRACT

A high frequency module incorporates a layered substrate. The layered substrate has a bottom surface and a top surface. Terminals are disposed on the bottom surface. SAW filters and inductors are mounted on the top surface. The layered substrate incorporates: a first conductor layer connecting the SAW filters to the inductors; a second conductor layer connected to the terminals and disposed at a location closer to the bottom surface than the first conductor layer; and a plurality of parallel signal paths each of which is formed using at least one through hole provided inside the layered substrate and each of which connects the first and second conductor layers to each other.

6 Claims, 13 Drawing Sheets

HIGH FREQUENCY MODULE UTILIZING A PLURALITY OF PARALLEL SIGNAL PATHS

BACKGROUND OF THE INVENTION

1. Field of the Invention

The present invention relates to a high frequency module incorporating a layered substrate including a plurality of dielectric layers and a plurality of conductor layers alternately stacked.

2. Description of the Related Art

Recently, cellular phones operable in a plurality of frequency bands (multibands) have been put to practical use. Front-end modules in which switching between transmission signals and reception signals is performed by a switch circuit are known as front-end modules incorporated in cellular phones that conform to the time division multiple access system and that are operable in a plurality of frequency bands. Such front-end modules are called antenna switch modules or high frequency switch modules, for example. In the present patent application, a combination of circuits performing processing of high frequency signals and a substrate for integrating these circuits, including such front-end modules, is called a high frequency module. In a high frequency module, for example, a layered substrate including a plurality of dielectric layers and a plurality of conductor layers alternately stacked is used as the substrate.

In a high frequency module having such a layered substrate, there are cases in which some of circuit components are formed using some of the conductor layers located inside the layered substrate, and at least one element as another circuit component is mounted on the top surface of the layered substrate. Furthermore, in such a high frequency module, there are cases in which a plurality of terminals for connection to external circuits are disposed on the bottom surface of the layered substrate. In such a high frequency module, when it is necessary to connect two of the circuit components to each other, they are connected to each other using through holes provided in the layered substrate or in the conductor layers inside the layered substrate, for example. When it is necessary to connect the at least one element mounted on the top surface of the layered substrate to the terminals provided on the bottom surface of the layered substrate, they are connected to each other using through holes provided in the layered substrate, for example.

JP 2002-217656A discloses a multilayer substrate including a power supply line for supplying a direct-current power to transistors. In this publication, the power supply line incorporates an inductor. This inductor is formed using a plurality of strip conductor traces inside the multilayer substrate. The front end and the terminal end of each of the strip conductor traces are respectively short-circuited and connected to separate terminals. In addition, each of the strip conductor traces is short-circuited by a via (through hole) at an arbitrary point between the front end and the terminal end.

JP 2000-059113A discloses a transmission line having such a configuration that a plurality of strip-shaped line electrodes are stacked with dielectric layers respectively disposed between adjacent ones of the line electrodes, and the line electrodes are connected through via holes (through holes).

In a high frequency module for processing high frequency signals, through holes on a signal transmission line each have an inductance. As a result, such a high frequency module incorporating a signal transmission line including through holes has a problem that the characteristics of the high frequency module vary in response to the magnitude of an inductance produced because of the through holes.

In a case in which an element mounted on the top surface of the layered substrate is connected to a terminal disposed on the bottom surface of the layered substrate by a signal transmission line including through holes, in particular, the inductance of the signal transmission line increases since the transmission line is long. Here, in many cases the element mounted on the top surface of the layered substrate is designed so that impedance matching is obtained between the element and an external circuit connected thereto via the terminal. In such cases, if the element mounted on the top surface of the layered substrate is connected to the terminal disposed on the bottom surface of the layered substrate by the signal transmission line including the through holes, there may arise a problem that it is impossible to achieve the impedance matching between the element and the external circuit because of the inductance resulting from the through holes.

Furthermore, in a case in which a plurality of circuit components are connected to terminals via a signal transmission line including through holes, in particular, the inductance of the signal transmission line is likely to greatly change depending on the configuration of the signal transmission line, and the characteristics of the high frequency module are thereby likely to vary.

OBJECT AND SUMMARY OF THE INVENTION

It is an object of the invention to provide a high frequency module incorporating a layered substrate and a signal transmission line connecting a plurality of circuit components and terminals to each other, the high frequency module being capable of suppressing the inductance of the signal transmission line.

A first high frequency module of the invention incorporates a layered substrate. The layered substrate includes: a plurality of dielectric layers and a plurality of conductor layers that are alternately stacked; a first surface and a second surface located at both sides of the layered substrate, the sides being opposed to each other in the direction in which the layers are stacked; and a terminal disposed on the first surface. The plurality of conductor layers include: a first conductor layer for connecting a plurality of circuit components to each other; and a second conductor layer connected to the terminal and disposed at a location closer to the first surface than the first conductor layer. The layered substrate further includes a plurality of parallel signal paths each of which is formed using at least one through hole provided inside the layered substrate and each of which connects the first and second conductor layers to each other.

According to the first high frequency module of the invention, the plurality of circuit components and the terminal are connected to each other through the first conductor layer, the parallel signal paths and the second conductor layer.

The first high frequency module of the invention may further incorporate a plurality of elements mounted on the second surface as the plurality of circuit components, and the first conductor layer may connect the plurality of elements to each other.

In the first high frequency module of the invention, the layered substrate may further include at least one through hole for connecting the second conductor layer to the terminal.

A second high frequency module of the invention incorporates: an antenna terminal connected to an antenna; a reception signal terminal outputting reception signals; a transmission signal terminal receiving transmission signals; a separation circuit disposed between the antenna terminal and the reception and transmission signal terminals and separating the reception signals and the transmission signals from each other; a filter provided between the separation circuit and the reception signal terminal; a matching element for impedance matching between the filter and an external circuit connected to the reception signal terminal, the matching element being connected to the filter and the reception signal terminal; and a layered substrate integrating the foregoing components.

In the second high frequency module of the invention, the layered substrate includes a plurality of dielectric layers and a plurality of conductor layers that are alternately stacked; and a first surface and a second surface located at both sides of the layered substrate, the sides being opposed to each other in the direction in which the layers are stacked. The reception signal terminal is disposed on the first surface. The filter and the matching element are mounted on the second surface. The plurality of conductor layers include: a first conductor layer for connecting the filter and the matching element to each other; and a second conductor layer connected to the reception signal terminal and disposed at a location closer to the first surface than the first conductor layer. The layered substrate further includes a plurality of parallel signal paths each of which is formed using at least one through hole provided inside the layered substrate and each of which connects the first and second conductor layers to each other.

According to the second high frequency module of the invention, the filter and the matching element mounted on the second surface of the layered substrate are connected to the terminal disposed on the first surface of the layered substrate through the first conductor layer, the parallel signal paths, and the second conductor layer.

In the second high frequency module of the invention, the filter may be formed using an acoustic wave element.

In the second high frequency module of the invention, the layered substrate may further include at least one through hole for connecting the second conductor layer to the reception signal terminal.

According to the first high frequency module of the invention, the plurality of circuit components and the terminal are connected to each other through the first conductor layer, the parallel signal paths each of which is formed using at least one through hole provided inside the layered substrate, and the second conductor layer. According to the invention, the signal transmission line connecting the plurality of circuit components and the terminal to each other includes the plurality of parallel signal paths, so that it is possible to suppress the inductance of the signal transmission line.

According to the second high frequency module of the invention, the filter and the matching element mounted on the second surface of the layered substrate are connected to the terminal disposed on the first surface of the layered substrate through the first conductor layer, the parallel signal paths each of which is formed using at least one through hole provided inside the layered substrate, and the second conductor layer. According to the invention, the signal transmission line connecting the filter, the matching element and the terminal to one another includes the plurality of parallel signal paths, so that it is possible to suppress the inductance of the signal transmission line.

Other and further objects, features and advantages of the invention will appear more fully from the following description.

DESCRIPTION OF A PREFERRED EMBODIMENT

A preferred embodiment of the invention will now be described in detail with reference to the accompanying drawings. A high frequency module of the embodiment of the invention is used as a front-end module incorporated in a cellular phone operable in four frequency bands. To be specific, the high frequency module of the embodiment processes transmission signals and reception signals of the American Global System for Mobile Communications (AGSM), transmission signals and reception signals of the Extended Global System for Mobile Communications (EGSM), transmission signals and reception signals of the Digital Cellular System (DCS), and transmission signals and reception signals of the Personal Communications Service (PCS).

The frequency band of transmission signals of the AGSM is 824 to 849 MHz. The frequency band of reception signals of the AGSM is 869 to 894 MHz. The frequency band of transmission signals of the EGSM is 880 to 915 MHz. The frequency band of reception signals of the EGSM is 925 to 960 MHz. The frequency band of transmission signals of the DCS is 1710 to 1785 MHz. The frequency band of reception signals of the DCS is 1805 to 1880 MHz. The frequency band of transmission signals of the PCS is 1850 to 1910 MHz. The frequency band of reception signals of the PCS is 1930 to 1990 MHz.

Figure 1:
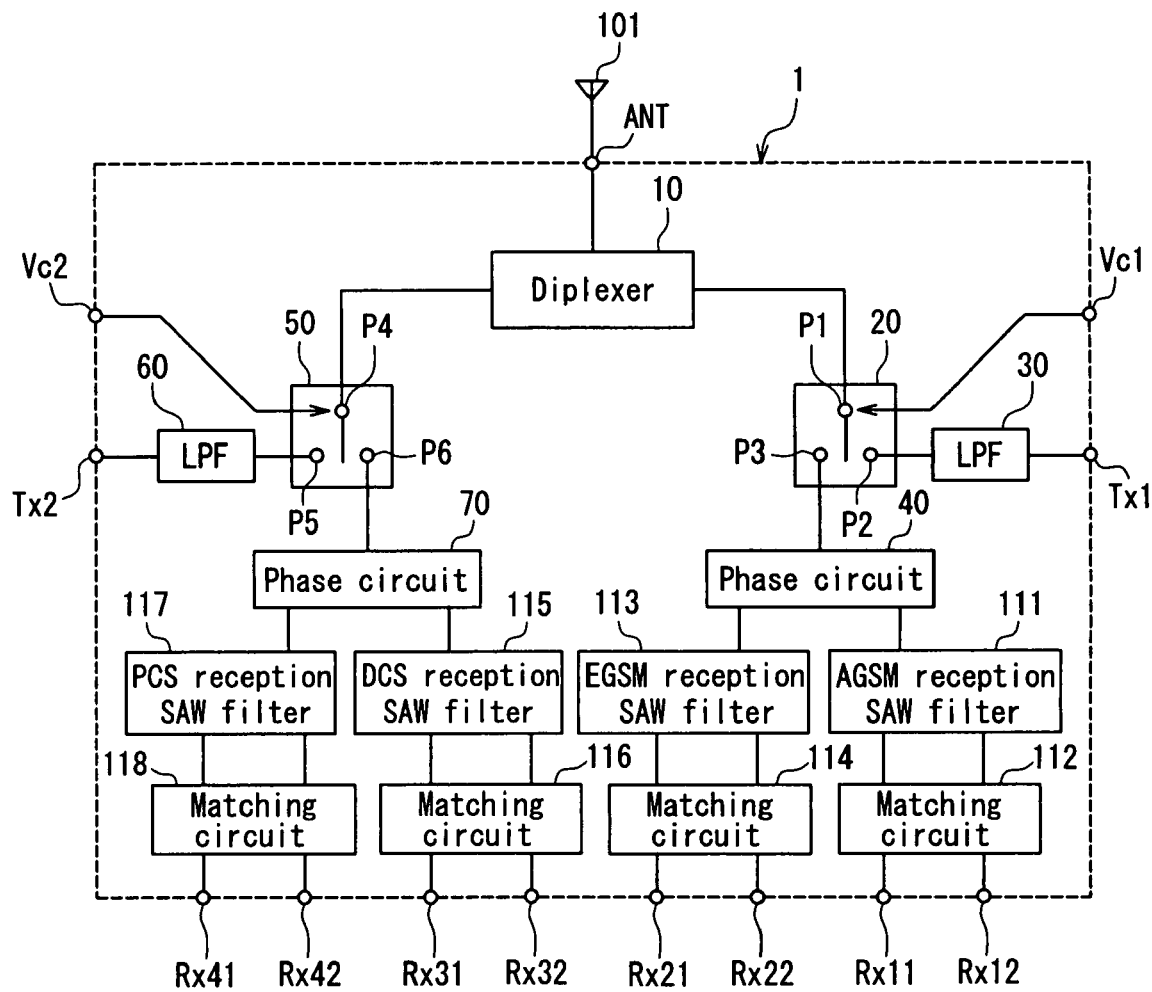
FIG. 1 is a block diagram illustrating the circuit configuration of a high frequency module of an embodiment of the invention.

FIG. 1 is a block diagram illustrating the circuit configuration of the high frequency module of the embodiment. The high frequency module 1 of the embodiment incorporates: an antenna terminal ANT; two AGSM reception signal terminals Rx11 and Rx12; two EGSM reception signal terminals Rx21 and Rx22; two DCS reception signal terminals Rx31 and Rx32; two PCS reception signal terminals Rx41 and Rx42; transmission signal terminals Tx1 and Tx2; and control terminals Vc1 and Vc2.

The antenna terminal ANT is connected to an antenna 101. The AGSM reception signal terminals Rx11 and Rx12 output AGSM reception signals in a balanced state. The EGSM reception signal terminals Rx21 and Rx22 output EGSM reception signals in a balanced state. The DCS reception signal terminals Rx31 and Rx32 output DCS reception signals in a balanced state. The PCS reception signal terminals Rx41 and Rx42 output PCS reception signals in a balanced state.

The transmission signal terminal Tx1 receives AGSM transmission signals and EGSM transmission signals. The transmission signal terminal Tx2 receives DCS transmission signals and PCS transmission signals. The control terminal Vc1 receives a first control signal. The control terminal Vc2 receives a second control signal.

The terminals ANT, Rx11, Rx12, Rx21, Rx22, Rx31, Rx32, Rx41, Rx42, Tx1, Tx2, Vc1 and Vc2 are designed to be connected to an external circuit.

The high frequency module 1 further incorporates: a diplexer 10, two switch circuits 20 and 50, two low-pass filters (LPF) 30 and 60, two phase circuits 40 and 70, an AGSM reception SAW filter 111, an EGSM reception SAW filter 113, a DCS reception SAW filter 115, a PCS reception SAW filter 117, and four matching circuits 112, 114, 116 and 118. The diplexer 10 is connected to the antenna terminal ANT and the switch circuits 20 and 50.

The switch circuit 20 has three ports P1 to P3. The port P1 is connected to the diplexer 10. The port P2 is connected to the LPF 30. The port P3 is connected to the phase circuit 40. In addition, the switch circuit 20 is connected to the control terminal Vc1. The switch circuit 20 selectively connects the port P2 or P3 to the port P1 in response to the state of the first control signal sent from the control terminal Vc1.

The switch circuit 50 has three ports P4 to P6. The port P4 is connected to the diplexer 10. The port P5 is connected to the LPF 60. The port P6 is connected to the phase circuit 70. In addition, the switch circuit 50 is connected to the control terminal Vc2. The switch circuit 50 selectively connects the port P5 or P6 to the port P4 in response to the state of the second control signal sent from the control terminal Vc2.

The LPF 30 is inserted between the transmission signal terminal Tx1 and the port P2 of the switch circuit 20. The LPF 30 rejects harmonics components included in AGSM transmission signals and EGSM transmission signals.

The LPF 60 is inserted between the transmission signal terminal Tx2 and the port P5 of the switch circuit 50. The LPF 60 rejects harmonics components included in DCS transmission signals and PCS transmission signals.

The phase circuit 40 is connected to the port P3 of the switch circuit 20, the AGSM reception SAW filter 111 and the EGSM reception SAW filter 113. The phase circuit 40 adjusts the impedance characteristic of the signal path between the port P3 and the SAW filter 111 and that of the signal path between the port P3 and the SAW filter 113, so that AGSM reception signals from the port P3 are sent to the SAW filter 111 and that EGSM reception signals from the port P3 are sent to the SAW filter 113.

The phase circuit 70 is connected to the port P6 of the switch circuit 50, the DCS reception SAW filter 115 and the PCS reception SAW filter 117. The phase circuit 70 adjusts the impedance characteristic of the signal path between the port P6 and the SAW filter 115 and that of the signal path between the port P6 and the SAW filter 117, so that DCS reception signals from the port P6 are sent to the SAW filter 115 and that PCS reception signals from the port P6 are sent to the SAW filter 117.

Each of the SAW filters 111, 113, 115 and 117 is a band-pass filter formed using a surface acoustic wave (SAW) element as an acoustic wave element. Alternatively, a filter formed using a bulk acoustic wave element as an acoustic wave element may be provided in place of each of the SAW filters 111, 113, 115 and 117. While the surface acoustic wave element utilizes acoustic waves propagating across the surface of a piezoelectric element (surface acoustic waves), the bulk acoustic wave element utilizes acoustic waves propagating inside a piezoelectric element (bulk acoustic waves).

Each of the SAW filters 111, 113, 115 and 117 has one input for receiving unbalanced signals and two outputs for outputting balanced signals. The input of the SAW filter 111 is connected to the phase circuit 40 while the two outputs of the SAW filter 111 are respectively connected to the reception signal terminals Rx11 and Rx12 through the matching circuit 112. The input of the SAW filter 113 is connected to the phase circuit 40 while the two outputs of the SAW filter 113 are respectively connected to the reception signal terminals Rx21 and Rx22 through the matching circuit 114. The input of the SAW filter 115 is connected to the phase circuit 70 while the two outputs of the SAW filter 115 are respectively connected to the reception signal terminals Rx31 and Rx32 through the matching circuit 116. The input of the SAW filter 117 is connected to the phase circuit 70 while the two outputs of the SAW filter 117 are respectively connected to the reception signal terminals Rx41 and Rx42 through the matching circuit 118.

The SAW filter 111 allows AGSM reception signals to pass and intercepts signals at frequencies outside the frequency band of AGSM reception signals. The SAW filter 113 allows EGSM reception signals to pass and intercepts signals at frequencies outside the frequency band of EGSM reception signals. The SAW filter 115 allows DCS reception signals to pass and intercepts signals at frequencies outside the frequency band of DCS reception signals. The SAW filter 117 allows PCS reception signals to pass and intercepts signals at frequencies outside the frequency band of PCS reception signals. Each of the SAW filters 111, 113, 115 and 117 has a function of converting unbalanced signals received at the input into balanced signals and outputting the signals from the output.

The matching circuit 112 is a circuit for matching the impedance between the SAW filter 111 and an external circuit connected to the terminals Rx11 and Rx12. The matching circuit 114 is a circuit for matching the impedance between the SAW filter 113 and an external circuit connected to the terminals Rx21 and Rx22. The matching circuit 116 is a circuit for matching the impedance between the SAW filter 115 and an external circuit connected to the terminals Rx31 and Rx32. The matching circuit 118 is a circuit for matching the impedance between the SAW filter 117 and an external circuit connected to the terminals Rx41 and Rx42.

Figure 2:
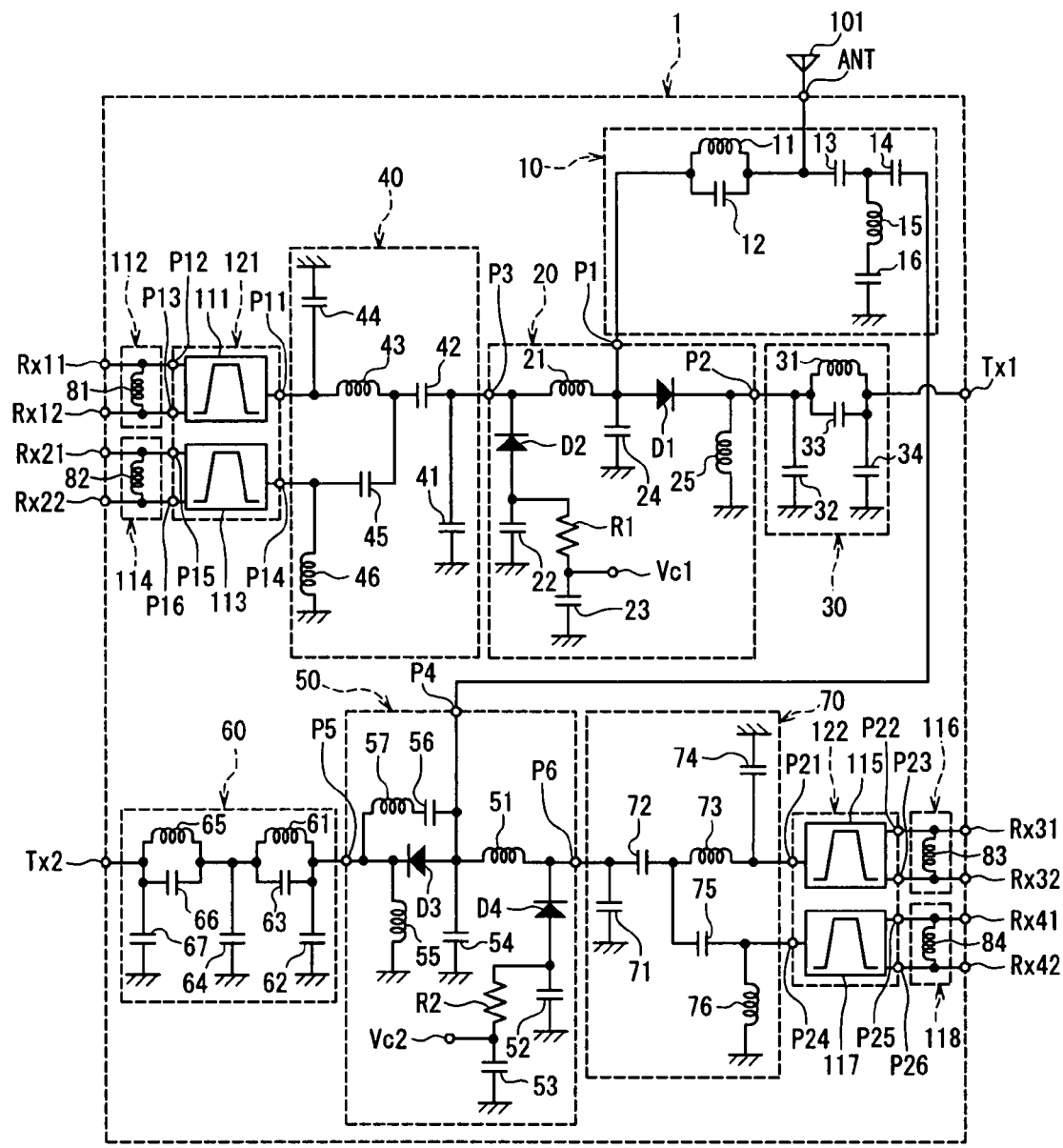
FIG. 2 is a schematic diagram illustrating the circuit configuration of the high frequency module of the embodiment of the invention.

Reference is now made to FIG. 2 to describe details of the circuit configuration of the high frequency module 1 shown in FIG. 1. FIG. 2 is a schematic diagram illustrating the circuit configuration of the high frequency module 1.

The diplexer 10 incorporates inductors 11 and 15 and capacitors 12, 13, 14 and 16. An end of each of the inductor 11 and the capacitors 12 and 13 is connected to the antenna terminal ANT. The other end of each of the inductor 11 and the capacitor 12 is connected to the port P1 of the switch circuit 20. An end of the capacitor 14 is connected to the other end of the capacitor 13. The other end of the capacitor 14 is connected to the port P4 of the switch circuit 50. An end of the inductor 15 is connected to the other end of the capacitor 13. The other end of the inductor 15 is grounded through the capacitor 16.

The inductor 11 and the capacitor 12 form a low-pass filter that allows AGSM signals and EGSM signals to pass and that intercepts DCS signals and PCS signals. The capacitors 13, 14 and 16 and the inductor 15 form a band-pass filter that allows DCS signals and PCS signals to pass and that intercepts AGSM signals and EGSM signals.

The switch circuit 20 incorporates: the ports P1 to P3, inductors 21 and 25, capacitors 22 to 24, a resistor R1, and diodes D1 and D2. The anode of the diode D1 and an end of each of the inductor 21 and the capacitor 24 are connected to the port P1. The other end of the capacitor 24 is grounded. The cathode of the diode D1 and an end of the inductor 25 are connected to the port P2. The other end of the inductor 25 is grounded. The other end of the inductor 21 and the cathode of the diode D2 are connected to the port P3. The anode of the diode D2 is connected to an end of the resistor R1 and grounded through the capacitor 22. The other end of the resistor R1 is connected to the control terminal Vc1 and grounded through the capacitor 23.

The LPF 30 incorporates an inductor 31 and capacitors 32 to 34. An end of each of the inductor 31 and the capacitors 33 and 34 is connected to the transmission signal terminal Tx1. An end of the capacitor 32 and the other end of each of the inductor 31 and the capacitor 33 are connected to the port P2 of the switch circuit 20. The other end of each of the capacitors 32 and 34 is grounded.

The phase circuit 40 incorporates: capacitors 41, 42, 44 and 45, and inductors 43 and 46. An end of each of the capacitors 41 and 42 is connected to the port P3 of the switch circuit 20. An end of the inductor 43 is connected to the other end of the capacitor 42. The other end of the inductor 43 and an end of the capacitor 44 are connected to the input of the SAW filter 111. The other end of the capacitor 44 is grounded. An end of the capacitor 45 is connected to the other end of the capacitor 42. The other end of the capacitor 45 and an end of the inductor 46 are connected to the input of the SAW filter 113. The other end of the capacitor 46 is grounded.

In the embodiment the SAW filters 111 and 113 are included in a dual SAW filter 121 that is a single component made up of a combination of the SAW filters 111 and 113. The dual SAW filter 121 has six ports P11 to P16 and four ports for grounding not shown. The port P11 is connected to the input of the SAW filter 111. The ports P12 and P13 are respectively connected to the two outputs of the SAW filter 111, and respectively connected to the reception signal terminals Rx11 and Rx12. The port P14 is connected to the input of the SAW filter 113. The ports P15 and P16 are respectively connected to the two outputs of the SAW filter 113, and respectively connected to the reception signal terminals Rx21 and Rx22. The other end of the inductor 43 and an end of the capacitor 44 in the phase circuit 40 are connected to the input of the SAW filter 111 through the port P11. The other end of the capacitor 45 and an end of the inductor 46 in the phase circuit 40 are connected to the input of the SAW filter 113 through the port P14.

The matching circuit 112 incorporates an inductor 81. An end of the inductor 81 is connected to one of the outputs of the SAW filter 111 through the port P12 and connected to the reception signal terminal Rx11. The other end of the inductor 81 is connected to the other of the outputs of the SAW filter 111 through the port P13 and connected to the reception signal terminal Rx12.

The matching circuit 114 incorporates an inductor 82. An end of the inductor 82 is connected to one of the outputs of the SAW filter 113 through the port P15 and connected to the reception signal terminal Rx21. The other end of the inductor 82 is connected to the other of the outputs of the SAW filter 113 through the port P16 and connected to the reception signal terminal Rx22.

The switch circuit 50 incorporates: the ports P4 to P6, inductors 51, 55 and 57, capacitors 52 to 54 and 56, a resistor R2, and diodes D3 and D4. The anode of the diode D3 and an end of each of the inductor 51 and the capacitors 54 and 56 are connected to the port P4. The other end of the capacitor 54 is grounded. The cathode of the diode D4 and an end of the inductor 55 are connected to the port P5. The other end of the inductor 55 is grounded. The other end of the inductor 51 and the cathode of the diode D4 are connected to the port P6. The anode of the diode D4 is connected to an end of the resistor R2 and grounded through the capacitor 52. The other end of the resistor R2 is connected to the control terminal Vc2 and grounded through the capacitor 53. An end of the inductor 57 is connected to the other end of the capacitor 56. The other end of the inductor 57 is connected to the port P5.

The LPF 60 incorporates inductors 61 and 65 and capacitors 62 to 64, 66 and 67. An end of each of the inductor 65 and the capacitors 66 and 67 is connected to the transmission signal terminal Tx2. An end of each of the inductor 61 and the capacitors 62 and 63 is connected to the port P5 of the switch circuit 50. The other ends of the inductors 61, 65 and the other ends of the capacitors 63, 66 are respectively connected to each other and grounded through the capacitor 64. The other end of each of the capacitors 62 and 67 is grounded.

The phase circuit 70 incorporates: capacitors 71, 72, 74 and 75, and inductors 73 and 76. An end of each of the capacitors 71 and 72 is connected to the port P6 of the switch circuit 50. An end of the inductor 73 is connected to the other end of the capacitor 72. The other end of the inductor 73 and an end of the capacitor 74 are connected to the input of the SAW filter 115. The other end of the capacitor 74 is grounded. An end of the capacitor 75 is connected to the other end of the capacitor 72. The other end of the capacitor 75 and an end of the inductor 76 are connected to the input of the SAW filter 117. The other end of the capacitor 76 is grounded.

In the embodiment the SAW filters 115 and 117 are included in a dual SAW filter 122 that is a single component made up of a combination of the SAW filters 115 and 117. The dual SAW filter 122 has six ports P21 to P26 and four ports for grounding not shown. The port P21 is connected to the input of the SAW filter 115. The ports P22 and P23 are respectively connected to the two outputs of the SAW filter 115, and respectively connected to the reception signal terminals Rx31 and Rx32. The port P24 is connected to the input of the SAW filter 117. The ports P25 and P26 are respectively connected to the two outputs of the SAW filter 117, and respectively connected to the reception signal terminals Rx41 and Rx42. The other end of the inductor 73 and an end of the capacitor 74 in the phase circuit 70 are connected to the input of the SAW filter 115 through the port P21. The other end of the capacitor 75 and an end of the inductor 76 in the phase circuit 70 is connected to the input of the SAW filter 117 through the port P24.

The matching circuit 116 incorporates an inductor 83. An end of the inductor 83 is connected to one of the outputs of the SAW filter 115 through the port P22 and connected to the reception signal terminal Rx31. The other end of the inductor 83 is connected to the other of the outputs of the SAW filter 115 through the port P23 and connected to the reception signal terminal Rx32.

The matching circuit 118 incorporates an inductor 84. An end of the inductor 84 is connected to one of the outputs of the SAW filter 117 through the port P25 and connected to the reception signal terminal Rx41. The other end of the inductor 84 is connected to the other of the outputs of the SAW filter 117 through the port P26 and connected to the reception signal terminal Rx42.

In the high frequency module 1, an AGSM reception signal received at the antenna terminal ANT passes through the diplexer 10, the switch circuit 20, the phase circuit 40, the SAW filter 111 and the matching circuit 112, and is sent to the reception signal terminals Rx11 and Rx12. An EGSM reception signal received at the antenna terminal ANT passes through the diplexer 10, the switch circuit 20, the phase circuit 40, the SAW filter 113 and the matching circuit 114, and is sent to the reception signal terminals Rx21 and Rx22. A DCS reception signal received at the antenna terminal ANT passes through the diplexer 10, the switch circuit 50, the phase circuit 70, the SAW filter 115 and the matching circuit 116, and is sent to the reception signal terminals Rx31 and Rx32. A PCS reception signal received at the antenna terminal ANT passes through the diplexer 10, the switch circuit 50, the phase circuit 70, the SAW filter 117 and the matching circuit 118, and is sent to the reception signal terminals Rx41 and Rx42. An AGSM transmission signal or an EGSM transmission signal received at the transmission signal terminal Tx1 passes through the LPF 30, the switch circuit 20 and the diplexer 10, and is sent to the antenna terminal ANT. A DCS transmission signal or a PCS transmission signal received at the transmission signal terminal Tx2 passes through the LPF 60, the switch circuit 50 and the diplexer 10, and is sent to the antenna terminal ANT.

The diplexer 10 and the switch circuits 20 and 50 separate AGSM or EGSM reception signals, AGSM or EGSM transmission signals, DCS or PCS reception signals, DCS or PCS transmission signals from one another. The diplexer 10 and the switch circuits 20 and 50 correspond to the separation circuit of the invention.

Figure 3:
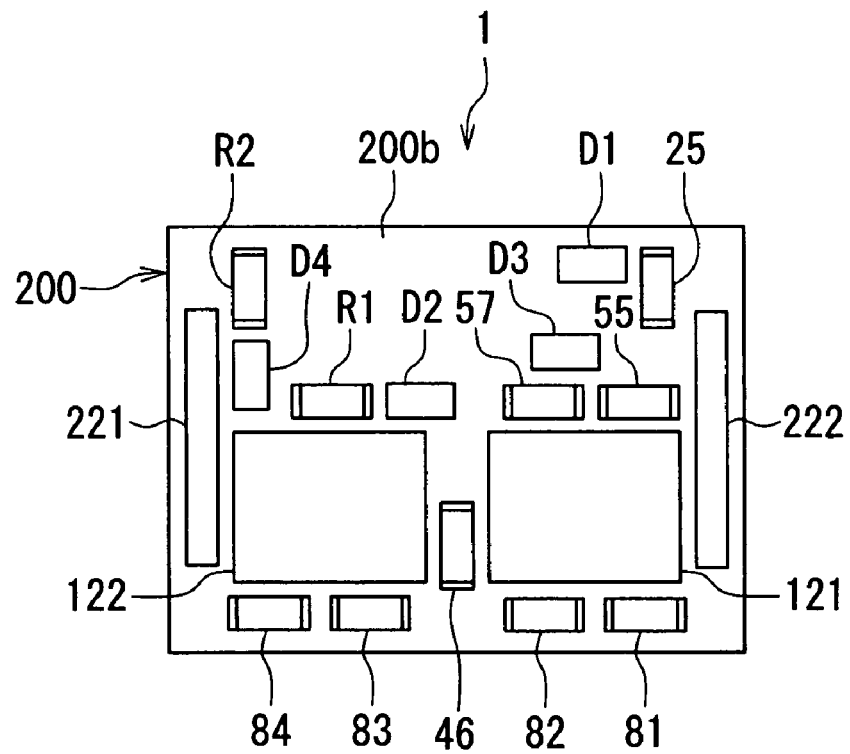
FIG. 3 is a top view of the high frequency module of the embodiment of the invention.
Figure 4:
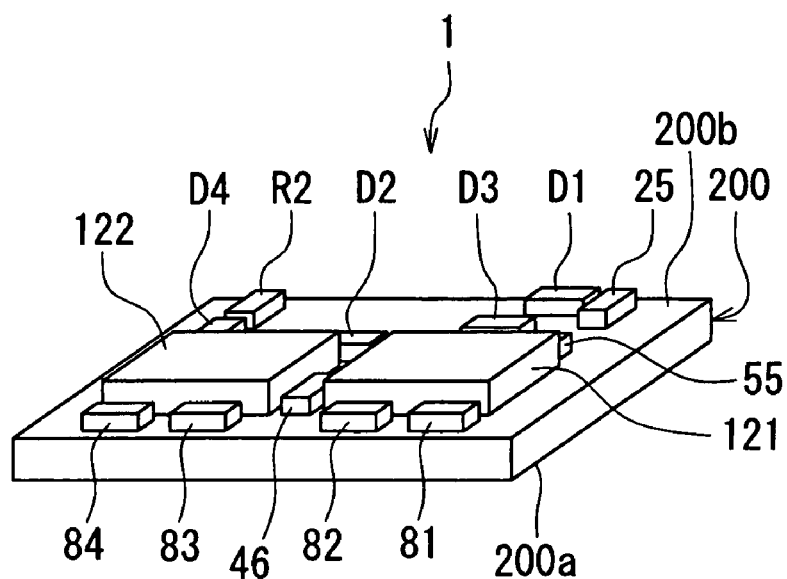
FIG. 4 is a perspective view of an appearance of the high frequency module of the embodiment of the invention.

Reference is now made to FIG. 3 and FIG. 4 to describe the structure of the high frequency module 1. FIG. 3 is a top view of the high frequency module 1. FIG. 4 is a perspective view illustrating an appearance of the high frequency module 1. As shown in FIG. 3 and FIG. 4, the high frequency module 1 incorporates a layered substrate 200 for integrating the previously mentioned components of the high frequency module 1. The layered substrate 200 includes a plurality of dielectric layers and a plurality of conductor layers that are alternately stacked. The layered substrate 200 has: a bottom surface 200a and a top surface 200b located at both sides of the layered substrate 200, the sides being opposed to each other in the direction in which the layers are stacked; and four side surfaces that couple the bottom surface 200a and the top surface 200b to each other, and the layered substrate 200 is rectangular-solid-shaped. The bottom surface 200a corresponds to the first surface of the layered substrate of the invention. The top surface 200b corresponds to the second surface of the layered substrate of the invention.

The circuits of the high frequency module 1 are formed using the conductor layers located inside the layered substrate 200 or on the surfaces of the layered substrate 200, and elements mounted on the top surface 200b of the layered substrate 200. Here is an example in which the dual SAW filters 121 and 122, the diodes D1 to D4, the resistors R1 and R2, and the inductors 25, 46, 55, 57, and 81 to 84 of FIG. 2 are mounted on the top surface 200b of the layered substrate 200. The layered substrate 200 is a multilayer substrate of low-temperature co-fired ceramic, for example.

The terminals ANT, Rx11, Rx12, Rx21, Rx22, Rx31, Rx32, Rx41, Rx42, Tx1, Tx2, Vc1 and Vc2, and a plurality of ground terminals that will be described later are disposed on the bottom surface 200a of the layered substrate 200.

Reference is now made to FIG. 5 to FIG. 21 to describe an example of configuration of the layered substrate 200. FIG. 5 to FIG. 20 illustrate top surfaces of the first to sixteenth (the lowest) dielectric layers from the top. FIG. 21 illustrates the sixteenth dielectric layer from the top and a conductor layer therebelow seen from above. Small circles of FIG. 5 to FIG. 20 indicate through holes.

Figure 5:
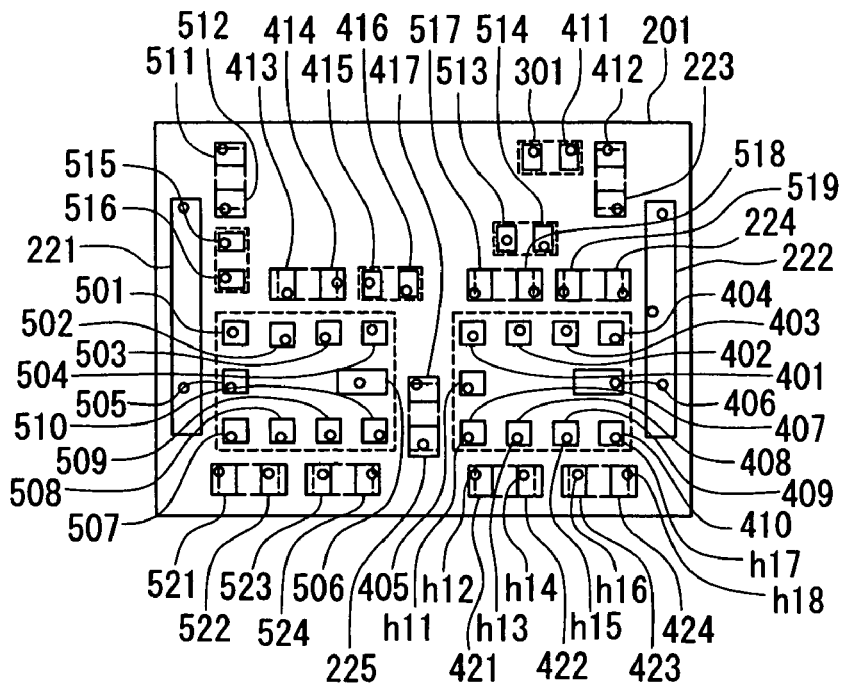
FIG. 5 is a top view illustrating a top surface of a first dielectric layer of the layered substrate of FIG. 3.

On the top surface of the first dielectric layer 201 of FIG. 5, there are formed: ten conductor layers 401 to 410 to which the ports P11 to P16 of the dual SAW filter 121 and four ports for grounding not shown are connected: and ten conductor layers 501 to 510 to which the ports P21 to P26 of the dual SAW filter 122 and four ports for grounding not shown are connected. On the top surface of the dielectric layer 201, there are formed conductor layers 221 to 225, 301, 411 to 417, 421 to 424, 511 to 519, and 521 to 524.

The ports P11, P12, P13, P14, P15 and P16 are connected to the conductor layers 404, 409, 410, 401, 407 and 408, respectively. The four ports for grounding (not shown) of the SAW filter 121 are connected to the conductor layers 402, 403, 405 and 406, respectively.

The ports P21, P22, P23, P24, P25 and P26 are connected to the conductor layers 504, 509, 510, 501, 507 and 508, respectively. The four ports for grounding (not shown) of the SAW filter 122 are connected to the conductor layers 502, 503, 505 and 506, respectively.

The anode of the diode D1 is connected to the conductor layer 301 while the cathode thereof is connected to the conductor layer 411. The anode of the diode D2 is connected to the conductor layer 415 while the cathode thereof is connected to the conductor layer 416. The anode of the diode D3 is connected to the conductor layer 513 while the cathode thereof is connected to the conductor layer 514. The anode of the diode D4 is connected to the conductor layer 515 while the cathode thereof is connected to the conductor layer 516. The resistor R1 has an end connected to the conductor layer 413 and the other end connected to the conductor layer 414. The resistor R2 has an end connected to the conductor layer 511 and the other end connected to the conductor layer 512.

The inductor 25 has an end connected to the conductor layer 223 and the other end connected to the conductor layer 412. The inductor 46 has an end connected to the conductor layer 225 and the other end connected to the conductor layer 417. The inductor 55 has an end connected to the conductor layer 224 and the other end connected to the conductor layer 519. The inductor 57 has an end connected to the conductor layer 517 and the other end connected to the conductor layer 518. The inductor 81 has an end connected to the conductor layer 423 and the other end connected to the conductor layer 424. The inductor 82 has an end connected to the conductor layer 421 and the other end connected to the conductor layer 422. The inductor 83 has an end connected to the conductor layer 523 and the other end connected to the conductor layer 524. The inductor 84 has an end connected to the conductor layer 521 and the other end connected to the conductor layer 522.

The dielectric layer 201 has through holes h11, h12, h13, h14, h15, h16, h17 and h18 that are respectively connected to the conductor layers 407, 421, 408, 422, 409, 423, 410 and 424. The dielectric layer 201 has a number of through holes, as shown in FIG. 5, besides those indicated with numerals.

Figure 6:
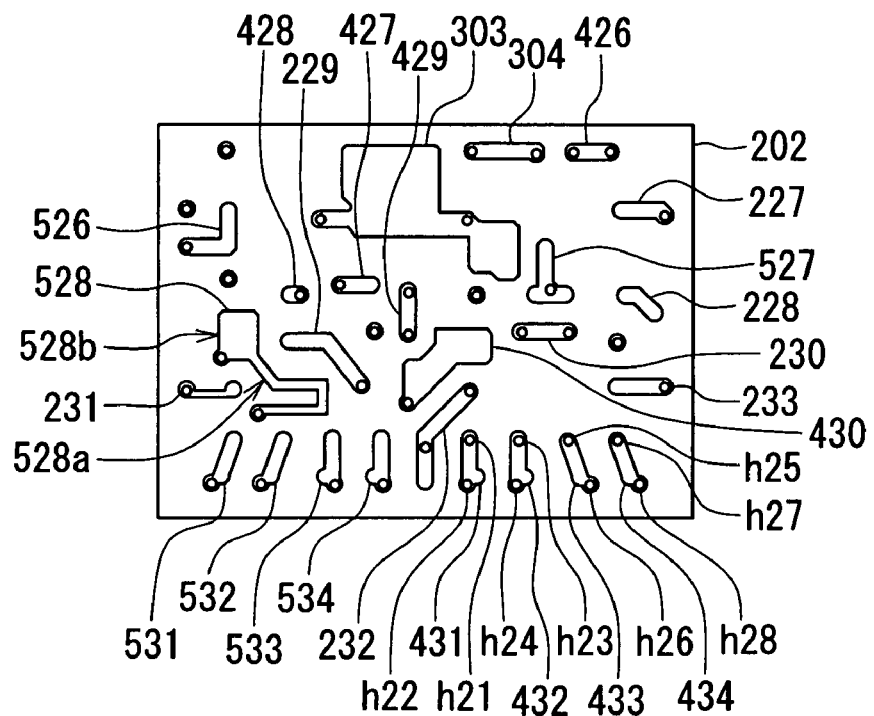
FIG. 6 is a top view illustrating a top surface of a second dielectric layer of the layered substrate of FIG. 3.

On the top surface of the second dielectric layer 202 of FIG. 6, there are formed conductor layers 303 and 430 for capacitors and conductor layers 227 to 233, 304, 426 to 429, 431 to 434, 526 to 528, and 531 to 534. The conductor layer 528 has an inductor-forming portion 528a and a capacitor-forming portion 528b.

The conductor layer 303 forms part of each of the capacitors 14 and 56 of FIG. 2. The conductor layer 513 of FIG. 5 is connected to the conductor layer 303 via a through hole formed in the dielectric layer 201. The conductor layer 430 forms part of the capacitor 45 of FIG. 2. The conductor layers 401 and 417 of FIG. 5 are connected to the conductor layer 430 via through holes formed in the dielectric layer 201. The capacitor-forming portion 528b of the conductor layer 528 forms part of the capacitor 75 of FIG. 2. The conductor layer 501 of FIG. 5 is connected to the conductor layer 528 via a through hole formed in the dielectric layer 201. The inductor-forming portion 528a of the conductor layer 528 forms part of the inductor 76 of FIG. 2.

The conductor layers 222 and 223 of FIG. 5 are connected to the conductor layer 227 via through holes formed in the dielectric layer 201. The conductor layers 222 and 224 of FIG. 5 are connected to the conductor layer 228 via through holes formed in the dielectric layer 201. The conductor layers 502, 503 and 506 of FIG. 5 are connected to the conductor layer 229 via through holes formed in the dielectric layer 201. The conductor layers 402 and 403 of FIG. 5 are connected to the conductor layer 230 via through holes formed in the dielectric layer 201. The conductor layers 221 and 505 of FIG. 5 are connected to the conductor layer 231 via through holes formed in the dielectric layer 201. The conductor layers 225 and 405 of FIG. 5 are connected to the conductor layer 232 via through holes formed in the dielectric layer 201. The conductor layers 222 and 406 of FIG. 5 are connected to the conductor layer 233 via through holes formed in the dielectric layer 201.

The conductor layer 301 of FIG. 5 is connected to the conductor layer 304 via a through hole formed in the dielectric layer 201. The conductor layers 411 and 412 of FIG. 5 are connected to the conductor layer 426 via through holes formed in the dielectric layer 201. The conductor layers 414 and 415 of FIG. 5 are connected to the conductor layer 427 via through holes formed in the dielectric layer 201. The conductor layer 413 of FIG. 5 is connected to the conductor layer 428 via a through hole formed in the dielectric layer 201. The conductor layer 416 of FIG. 5 is connected to the conductor layer 429 via a through hole formed in the dielectric layer 201.

The conductor layers 407 and 421 of FIG. 5 are connected to the conductor layer 431 via the through holes h11 and h12, respectively. Through holes h21 and h22 formed in the dielectric layer 202 are connected to the conductor layer 431. The conductor layers 408 and 422 of FIG. 5 are connected to the conductor layer 432 via the through holes h13 and H14, respectively. Through holes h23 and h24 formed in the dielectric layer 202 are connected to the conductor layer 432. The conductor layers 409 and 423 of FIG. 5 are connected to the conductor layer 433 via the through holes h15 and h16, respectively. Through holes h25 and h26 formed in the dielectric layer 202 are connected to the conductor layer 433. The conductor layers 410 and 424 of FIG. 5 are connected to the conductor layer 434 via the through holes h17 and h18, respectively. Through holes h27 and h28 formed in the dielectric layer 202 are connected to the conductor layer 434.

The conductor layers 512 and 515 of FIG. 5 are connected to the conductor layer 526 via through holes formed in the dielectric layer 201. The conductor layers 514, 518 and 519 of FIG. 5 are connected to the conductor layer 527 via through holes formed in the dielectric layer 201. The conductor layers 507 and 521 of FIG. 5 are connected to the conductor layer 531 via through holes formed in the dielectric layer 201. The conductor layers 508 and 522 of FIG. 5 are connected to the conductor layer 532 via through holes formed in the dielectric layer 201. The conductor layers 509 and 523 of FIG. 5 are connected to the conductor layer 533 via through holes formed in the dielectric layer 201. The conductor layers 510 and 524 of FIG. 5 are connected to the conductor layer 534 via through holes formed in the dielectric layer 201.

The dielectric layer 202 has a number of through holes, as shown in FIG. 6, besides those indicated with numerals.

Figure 7:
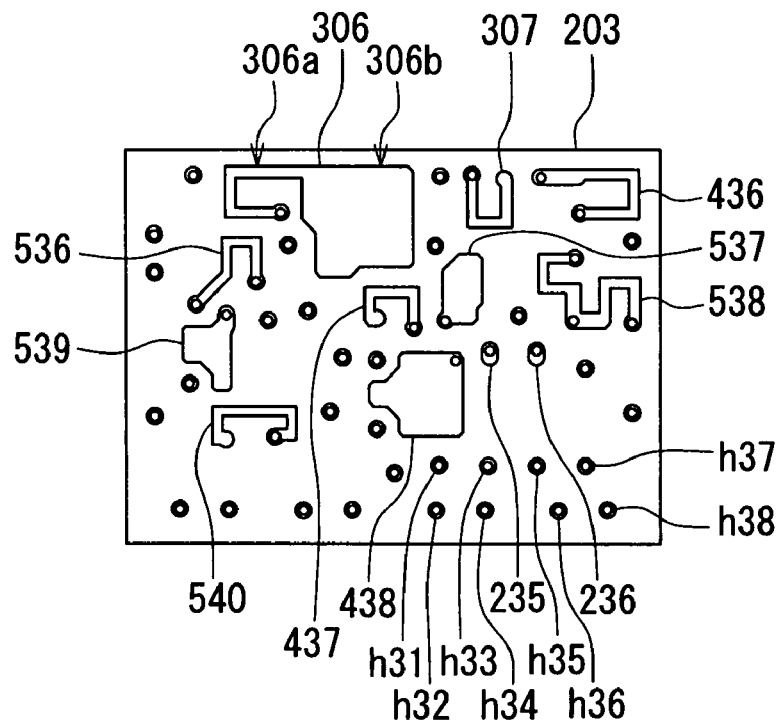
FIG. 7 is a top view illustrating a top surface of a third dielectric layer of the layered substrate of FIG. 3.

On the top surface of the third dielectric layer 203 of FIG. 7, there are formed conductor layers 438, 537 and 539 for capacitors, conductor layers 235, 236 and 306, and conductor layers 307, 436, 437, 536, 538 and 540 for inductors. The conductor layer 306 has an inductor-forming portion 306a and a capacitor-forming portion 306b. The conductor layer 230 of FIG. 6 is connected to the conductor layers 235 and 236 via through holes formed in the dielectric layer 202.

The capacitor-forming portion 306b of the conductor layer 306, together with part of the conductor layer 303 of FIG. 6, forms the capacitor 14 of FIG. 2, and also forms part of the capacitor 13 of FIG. 2. The conductor layer 438 forms part of the capacitor 45 of FIG. 2. The conductor layer 537 forms part of the capacitor 56 of FIG. 2. The conductor layer 517 of FIG. 5 is connected to the conductor layer 537 via through holes formed in the dielectric layers 201 and 202. The conductor layer 539 forms part of the capacitor 75 of FIG. 2.

The inductor-forming portion 306a of the conductor layer 306 forms part of the inductor 15 of FIG. 2. The conductor layer 304 of FIG. 6 is connected to the conductor layer 307 via through holes formed in the dielectric layer 202. The conductor layer 307 forms part of the inductor 11 of FIG. 2. The conductor layer 426 of FIG. 6 is connected to the conductor layer 436 via through holes formed in the dielectric layer 202. The conductor layer 436 forms part of the inductor 31 of FIG. 2. The conductor layer 429 of FIG. 6 is connected to the conductor layer 437 via through holes formed in the dielectric layer 202. The conductor layer 437 forms part of the inductor 21 of FIG. 2

The conductor layer 516 of FIG. 5 is connected to the conductor layer 536 via through holes formed in the dielectric layers 201 and 202. The conductor layer 536 forms part of the inductor 51 of FIG. 2. The conductor layer 538 forms part of each of the inductors 61 and 65 of FIG. 2. The conductor layer 528 of FIG. 6 is connected to the conductor layer 540 via a through hole formed in the dielectric layer 202. The conductor layer 540 forms part of the inductor 76 of FIG. 2.

The dielectric layer 203 has through holes h31, h32, h33, h34, h35, h36, h37 and h38 that are respectively connected to the through holes h21, h22, h23, h24, h25, h26, h27 and h28. The dielectric layer 203 has a number of through holes, as shown in FIG. 7, besides those indicated with numerals.

Figure 8:
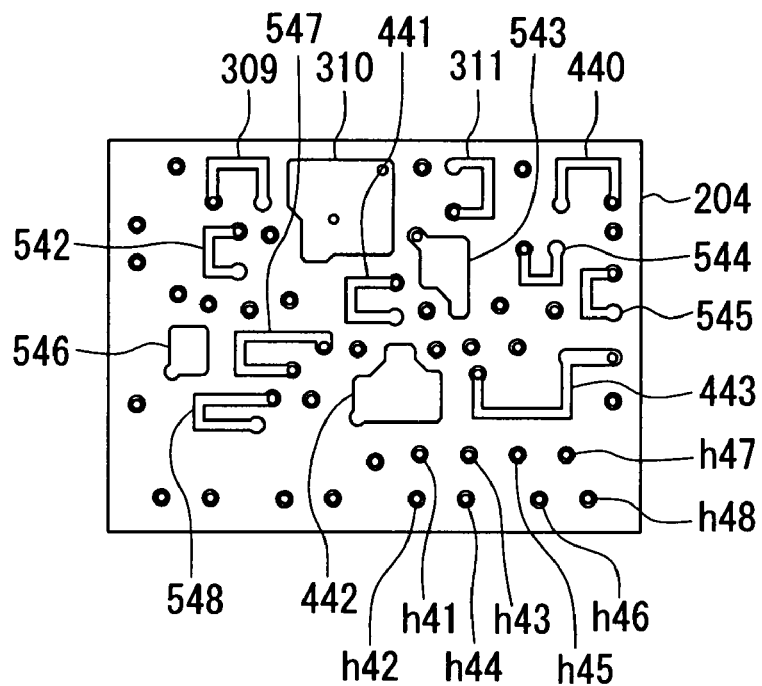
FIG. 8 is a top view illustrating a top surface of a fourth dielectric layer of the layered substrate of FIG. 3.

On the top surface of the fourth dielectric layer 204 of FIG. 8, there are formed conductor layers 310, 442, 543 and 546 for capacitors and conductor layers 309, 311, 440, 441, 443, 542, 544, 545, 547 and 548 for inductors. The conductor layer 310, together with the capacitor-forming portion 306b of the conductor layer 306 of FIG. 7, forms the capacitor 13 of FIG. 2. The conductor layer 442 forms part of the capacitor 45 of FIG. 2. The conductor layer 430 of FIG. 6 is connected to the conductor layer 442 via through holes formed in the dielectric layers 202 and 203. The conductor layer 543 forms part of the capacitor 56 of FIG. 2. The conductor layer 303 of FIG. 6 is connected to the conductor layer 543 via through holes formed in the dielectric layers 202 and 203. The conductor layer 546 forms part of the capacitor 75 of FIG. 2. The conductor layer 528 of FIG. 6 is connected to the conductor layer 546 via through holes formed in the dielectric layers 202 and 203.

The conductor layer 306 of FIG. 7 is connected to the conductor layer 309 via a through hole formed in the dielectric layer 203. The conductor layer 309 forms part of the inductor 15 of FIG. 2. The conductor layer 307 of FIG. 7 is connected to the conductor layer 311 via a through hole formed in the dielectric layer 203. The conductor layer 311 forms part of the inductor 11 of FIG. 2. The conductor layer 436 of FIG. 7 is connected to the conductor layer 440 via through holes formed in the dielectric layer 203. The conductor layer 440 forms part of the inductor 31 of FIG. 2. The conductor layer 437 of FIG. 7 is connected to the conductor layer 441 via a through hole formed in the dielectric layer 203. The conductor layer 441 forms part of the inductor 21 of FIG. 2. The conductor layer 404 of FIG. 5 is connected to the conductor layer 443 via through holes formed in the dielectric layers 201 to 203. The conductor layer 443 forms part of the inductor 43 of FIG. 2.

The conductor layer 536 of FIG. 7 is connected to the conductor layer 542 via through holes formed in the dielectric layer 203. The conductor layer 542 forms part of the inductor 51 of FIG. 2. The conductor layer 538 of FIG. 7 is connected to the conductor layers 544 and 545 via through holes formed in the dielectric layer 203. The conductor layers 544 and 545 form respective parts of the inductors 61 and 65 of FIG. 2. The conductor layer 504 of FIG. 5 is connected to the conductor layer 547 via through holes formed in the dielectric layers 201 to 203. The conductor layer 547 forms part of the inductor 73 of FIG. 2. The conductor layer 540 of FIG. 7 is connected to the conductor layer 548 via a through hole formed in the dielectric layer 203. The conductor layer 548 forms part of the inductor 76 of FIG. 2.

The dielectric layer 204 has through holes h41, h42, h43, h44, h45, h46, h47 and h48 that are respectively connected to the through holes h31, h32, h33, h34, h35, h36, h37 and h38. The dielectric layer 204 has a number of through holes, as shown in FIG. 8, besides those indicated with numerals.

Figure 9:
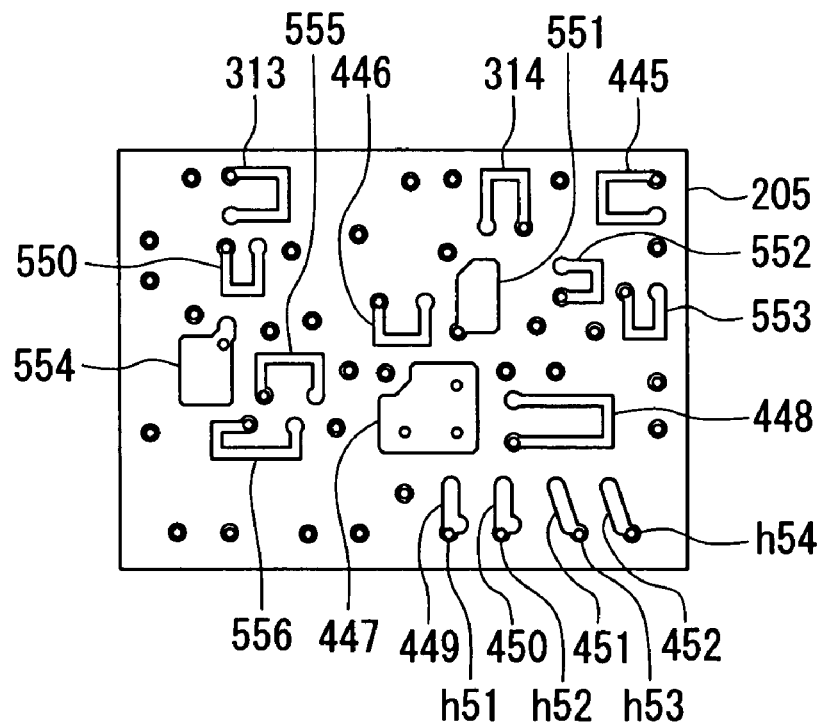
FIG. 9 is a top view illustrating a top surface of a fifth dielectric layer of the layered substrate of FIG. 3.

On the top surface of the fifth dielectric layer 205 of FIG. 9, there are formed conductor layers 447, 551 and 554 for capacitors, conductor layers 449 to 452, and conductor layers 313, 314, 445, 446, 448, 550, 552, 553, 555 and 556 for inductors. The conductor layer 447, together with the conductor layers 430, 438 and 442, forms the capacitor 45 of FIG. 2. The conductor layer 438 of FIG. 7 is connected to the conductor layer 447 via through holes formed in the dielectric layers 203 and 204. The conductor layer 551 forms part of the capacitor 56 of FIG. 2. The conductor layer 537 of FIG. 7 is connected to the conductor layer 551 via through holes formed in the dielectric layers 203 and 204. The conductor layer 554, together with the conductor layers 539 and 546 and the capacitor-forming portion 528b of the conductor layer 528, forms the capacitor 75 of FIG. 2. The conductor layer 539 of FIG. 7 is connected to the conductor layer 554 via through holes formed in the dielectric layers 203 and 204.

The conductor layer 431 of FIG. 6 is connected to the conductor layer 449 via the through holes h21, h22, h31, h32, h41 and h42. A through hole h51 formed in the dielectric layer 205 is connected to the conductor layer 449. The conductor layer 432 of FIG. 6 is connected to the conductor layer 450 via the through holes h23, h24, h33, h34, h43 and h44. A through hole h52 formed in the dielectric layer 205 is connected to the conductor layer 450. The conductor layer 433 of FIG. 6 is connected to the conductor layer 451 via the through holes h25, h26, h35, h36, h45 and h46. A through hole h53 formed in the dielectric layer 205 is connected to the conductor layer 451. The conductor layer 434 of FIG. 6 is connected to the conductor layer 452 via the through holes h27, h28, h37, h38, h47 and h48. A through hole h54 formed in the dielectric layer 205 is connected to the conductor layer 452.

The conductor layer 309 of FIG. 8 is connected to the conductor layer 313 via a through hole formed in the dielectric layer 204. The conductor layer 313 forms part of the inductor 15 of FIG. 2. The conductor layer 311 of FIG. 8 is connected to the conductor layer 314 via a through hole formed in the dielectric layer 204. The conductor layer 314 forms part of the inductor 11 of FIG. 2. The conductor layer 440 of FIG. 8 is connected to the conductor layer 445 via a through hole formed in the dielectric layer 204. The conductor layer 445 forms part of the inductor 31 of FIG. 2. The conductor layer 441 of FIG. 8 is connected to the conductor layer 446 via a through hole formed in the dielectric layer 204. The conductor layer 446 forms part of the inductor 21 of FIG. 2. The conductor layer 443 of FIG. 8 is connected to the conductor layer 448 via through holes formed in the dielectric layer 204. The conductor layer 448 forms part of the inductor 43 of FIG. 2.

The conductor layer 542 of FIG. 8 is connected to the conductor layer 550 via a through hole formed in the dielectric layer 204. The conductor layer 550 forms part of the inductor 51 of FIG. 2. The conductor layer 544 of FIG. 8 is connected to the conductor layer 552 via a through hole formed in the dielectric layer 204. The conductor layer 552 forms part of the inductor 61 of FIG. 2. The conductor layer 545 of FIG. 8 is connected to the conductor layer 553 via a through hole formed in the dielectric layer 204. The inductor 65 of FIG. 2 is formed of the conductor layers 545 and 553 and part of the conductor layer 538. The conductor layer 547 of FIG. 8 is connected to the conductor layer 555 via through holes formed in the dielectric layer 204. The conductor layer 555 forms part of the inductor 73 of FIG. 2. The conductor layer 548 of FIG. 8 is connected to the conductor layer 556 via a through hole formed in the dielectric layer 204. The conductor layer 556 forms part of the inductor 76 of FIG. 2.

The dielectric layer 205 has a number of through holes, as shown in FIG. 9, besides those indicated with numerals.

Figure 10:
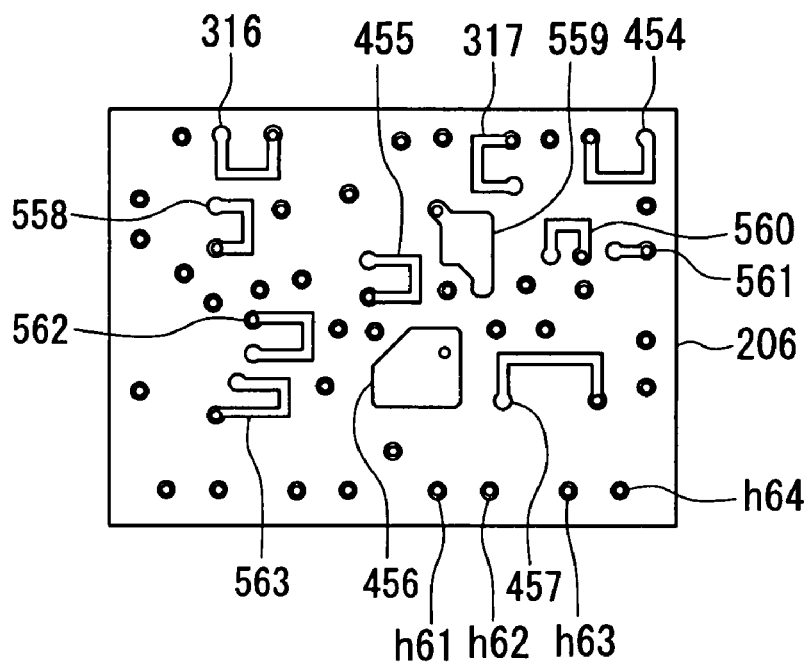
FIG. 10 is a top view illustrating a top surface of a sixth dielectric layer of the layered substrate of FIG. 3.

On the top surface of the sixth dielectric layer 206 of FIG. 10, there are formed conductor layers 456 and 559 for capacitors, a conductor layer 561, and conductor layers 316, 317, 454, 455, 457, 558, 560, 562 and 563 for inductors. The conductor layer 456 forms part of the capacitor 42 of FIG. 2. The conductor layer 447 of FIG. 9 is connected to the conductor layer 456 via through holes formed in the dielectric layer 205. The conductor layer 559 forms part of the capacitor 56 of FIG. 2. The conductor layer 543 of FIG. 8 is connected to the conductor layer 559 via through holes formed in the dielectric layers 204 and 205. The conductor layer 553 of FIG. 9 is connected to the conductor layer 561 via a through hole formed in the dielectric layer 205.

The conductor layer 313 of FIG. 9 is connected to the conductor layer 316 via a through hole formed in the dielectric layer 205. The inductor 15 of FIG. 2 is formed of the conductor layers 309, 313 and 316 and the inductor-forming portion 306a of the conductor layer 306. The conductor layer 314 of FIG. 9 is connected to the conductor layer 317 via a through hole formed in the dielectric layer 205. The conductor layer 317 forms part of the inductor 11 of FIG. 2. The conductor layer 445 of FIG. 9 is connected to the conductor layer 454 via a through hole formed in the dielectric layer 205. The conductor layer 454 forms part of the inductor 31 of FIG. 2. The conductor layer 446 of FIG. 9 is connected to the conductor layer 455 via a through hole formed in the dielectric layer 205. The conductor layer 455 forms part of the inductor 21 of FIG. 2. The conductor layer 448 of FIG. 9 is connected to the conductor layer 457 via a through hole formed in the dielectric layer 205. The conductor layer 457 forms part of the inductor 43 of FIG. 2.

The conductor layer 550 of FIG. 9 is connected to the conductor layer 558 via a through hole formed in the dielectric layer 205. The conductor layer 558 forms part of the inductor 51 of FIG. 2. The conductor layer 552 of FIG. 9 is connected to the conductor layer 560 via a through hole formed in the dielectric layer 205. The inductor 61 of FIG. 2 is formed of the conductor layers 544, 552 and 560 and another part of the conductor layer 538. The conductor layer 555 of FIG. 9 is connected to the conductor layer 562 via a through hole formed in the dielectric layer 205. The conductor layer 562 forms part of the inductor 73 of FIG. 2. The conductor layer 556 of FIG. 9 is connected to the conductor layer 563 via a through hole formed in the dielectric layer 205. The conductor layer 563 forms part of the inductor 76 of FIG. 2.

The dielectric layer 206 has through holes h61, h62, h63 and h64 that are respectively connected to the through holes h51, h52, h53 and h54. The dielectric layer 206 has a number of through holes, as shown in FIG. 10, besides those indicated with numerals.

Figure 11:
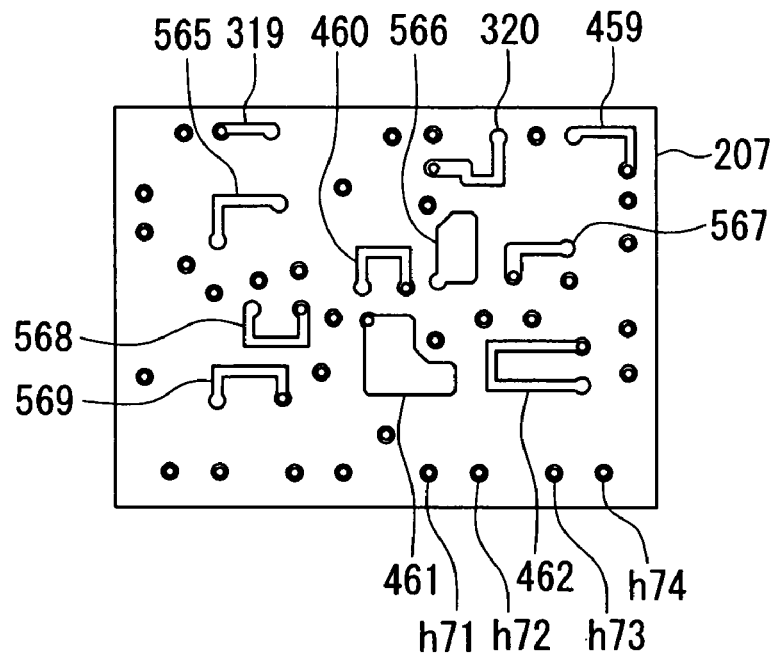
FIG. 11 is a top view illustrating a top surface of a seventh dielectric layer of the layered substrate of FIG. 3.

On the top surface of the seventh dielectric layer 207 of FIG. 11, there are formed conductor layers 461 and 566 for capacitors, conductor layers 319 and 567, and conductor layers 320, 459, 460, 462, 565, 568 and 569 for inductors. The conductor layer 461 forms part of the capacitor 42 of FIG. 2. The conductor layer 429 of FIG. 6 is connected to the conductor layer 461 via through holes formed in the dielectric layers 202 to 206. The conductor layer 556 forms part of the capacitor 56 of FIG. 2. The conductor layer 551 of FIG. 9 is connected to the conductor layer 566 via through holes formed in the dielectric layers 205 and 206.

The conductor layer 316 of FIG. 10 is connected to the conductor layer 319 via a through hole formed in the dielectric layer 206. The conductor layer 560 of FIG. 10 is connected to the conductor layer 567 via a through hole formed in the dielectric layer 206. The conductor layer 527 of FIG. 6 is connected to the conductor layer 567 via through holes formed in the dielectric layers 202 to 206. The conductor layer 317 of FIG. 10 is connected to the conductor layer 320 via a through hole formed in the dielectric layer 206. The inductor 11 of FIG. 2 is formed of the conductor layers 307, 311, 314, 317 and 320.

The conductor layer 454 of FIG. 10 is connected to the conductor layer 459 via a through hole formed in the dielectric layer 206. The inductor 31 of FIG. 2 is formed of the conductor layers 436, 440, 445, 454 and 459. The conductor layer 455 of FIG. 10 is connected to the conductor layer 460 via a through hole formed in the dielectric layer 206. The conductor layer 460 forms part of the inductor 21 of FIG. 2. The conductor layer 457 of FIG. 10 is connected to the conductor layer 462 via a through hole formed in the dielectric layer 206. The conductor layer 462 forms part of the inductor 43 of FIG. 2.

The conductor layer 558 of FIG. 10 is connected to the conductor layer 565 via a through hole formed in the dielectric layer 206. The conductor layer 303 of FIG. 6 is connected to the conductor layer 565 via through holes formed in the dielectric layers 202 to 206. The inductor 51 of FIG. 2 is formed of the conductor layers 536, 542, 550, 558 and 565. The conductor layer 562 of FIG. 10 is connected to the conductor layer 568 via a through hole formed in the dielectric layer 206. The inductor 73 of FIG. 2 is formed of the conductor layers 547, 555, 562 and 568. The conductor layer 563 of FIG. 10 is connected to the conductor layer 569 via a through hole formed in the dielectric layer 206. The conductor layer 569 forms part of the inductor 76 of FIG. 2.

The dielectric layer 207 has through holes h71, h72, h73 and h74 that are respectively connected to the through holes h61, h62, h63 and h64. The dielectric layer 207 has a number of through holes, as shown in FIG. 11, besides those indicated with numerals.

Figure 12:
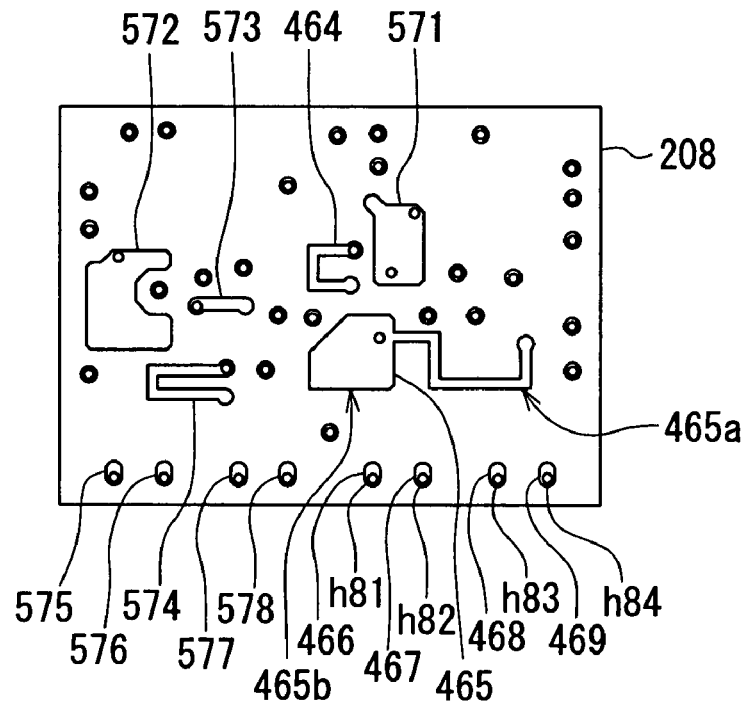
FIG. 12 is a top view illustrating a top surface of an eighth dielectric layer of the layered substrate of FIG. 3.

On the top surface of the eighth dielectric layer 208 of FIG. 12, there are formed conductor layers 571 and 572 for capacitors, conductor layers 465 to 469, 573, and 575 to 578, and conductor layers 464 and 574 for inductors. The conductor layer 465 has an inductor-forming portion 465a and a capacitor-forming portion 465b. The conductor layer 571, together with the conductor layers 537, 543, 551, 559 and 566 and another part of the conductor layer 303, forms the capacitor 56 of FIG. 2. The conductor layer 559 of FIG. 10 is connected to the conductor layer 571 via through holes formed in the dielectric layers 206 and 207. The conductor layer 572 forms part of the capacitor 72 of FIG. 2. The conductor layer 536 of FIG. 7 is connected to the conductor layer 572 via through holes formed in the dielectric layers 203 to 207.

The capacitor-forming portion 465b of the conductor layer 465 forms part of the capacitor 42 of FIG. 2. The conductor layer 462 of FIG. 11 is connected to the conductor layer 465 via a through hole formed in the dielectric layer 207. The conductor layer 456 of FIG. 10 is connected to the conductor layer 465 via through holes formed in the dielectric layers 206 and 207. The inductor 43 of FIG. 2 is formed of the conductor layers 443, 448, 457 and 462 and the inductor-forming portion 465a of the conductor layer 465.

The conductor layer 449 of FIG. 9 is connected to the conductor layer 466 via the through holes h51, h61 and h71. A through hole h81 formed in the dielectric layer 208 is connected to the conductor layer 466. The conductor layer 450 of FIG. 9 is connected to the conductor layer 467 via the through holes h52, h62 and h72. A through hole h82 formed in the dielectric layer 208 is connected to the conductor layer 467. The conductor layer 451 of FIG. 9 is connected to the conductor layer 468 via the through holes h53, h63 and h73. A through hole h83 formed in the dielectric layer 208 is connected to the conductor layer 468. The conductor layer 452 of FIG. 9 is connected to the conductor layer 469 via the through holes h54, h64 and h74. A through hole h84 formed in the dielectric layer 208 is connected to the conductor layer 469.

The conductor layer 568 of FIG. 11 is connected to the conductor layer 573 via a through hole formed in the dielectric layer 207. The conductor layer 531 of FIG. 6 is connected to the conductor layer 575 via through holes formed in the dielectric layers 202 to 207. The conductor layer 532 of FIG. 6 is connected to the conductor layer 576 via through holes formed in the dielectric layers 202 to 207. The conductor layer 533 of FIG. 6 is connected to the conductor layer 577 via through holes formed in the dielectric layers 202 to 207. The conductor layer 534 of FIG. 6 is connected to the conductor layer 578 via through holes formed in the dielectric layers 202 to 207.

The conductor layer 460 of FIG. 11 is connected to the conductor layer 464 via a through hole formed in the dielectric layer 207. The conductor layer 464 forms part of the inductor 21 of FIG. 2. The conductor layer 569 of FIG. 11 is connected to the conductor layer 574 via a through hole formed in the dielectric layer 207. The conductor layer 574 forms part of the inductor 76 of FIG. 2.

The dielectric layer 208 has a number of through holes, as shown in FIG. 12, besides those indicated with numerals.

Figure 13:
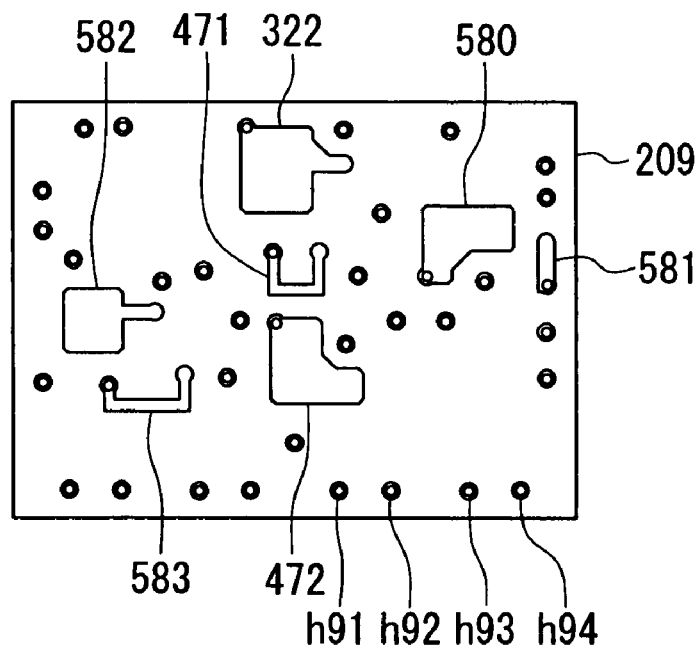
FIG. 13 is a top view illustrating a top surface of a ninth dielectric layer of the layered substrate of FIG. 3.

On the ninth dielectric layer 209 of FIG. 13, there are formed conductor layers 322, 472, and 580 to 582 for capacitors and conductor layers 471 and 583 for inductors. The conductor layer 322 forms part of the capacitor 12 of FIG. 2. The conductor layer 320 of FIG. 11 is connected to the conductor layer 322 via through holes formed in the dielectric layers 207 and 208. The conductor layer 310 of FIG. 8 is connected to the conductor layer 322 via through holes formed in the dielectric layers 204 to 208. The conductor layer 472 forms part of the capacitor 42 of FIG. 2. The conductor layer 461 of FIG. 11 is connected to the conductor layer 472 via through holes formed in the dielectric layers 207 and 208.

The conductor layer 580 forms part of the capacitor 63 of FIG. 2. The conductor layer 567 of FIG. 11 is connected to the conductor layer 580 via through holes formed in the dielectric layers 207 and 208. The conductor layer 581 forms part of the capacitor 66 of FIG. 2. The conductor layer 561 of FIG. 10 is connected to the conductor layer 581 via through holes formed in the dielectric layers 206 to 208. The conductor layer 582 forms part of the capacitor 72 of FIG. 2. The conductor layer 573 of FIG. 12 is connected to the conductor layer 582 via a through hole formed in the dielectric layer 208. The conductor layer 554 of FIG. 9 is connected to the conductor layer 582 via through holes formed in the dielectric layers 205 to 208.

The conductor layer 464 of FIG. 12 is connected to the conductor layer 471 via a through hole formed in the dielectric layer 208. The inductor 21 of FIG. 2 is formed of the conductor layers 437, 441, 446, 455, 460, 464 and 471. The conductor layer 574 of FIG. 12 is connected to the conductor layer 583 via a through hole formed in the dielectric layer 208. The inductor 76 of FIG. 2 is formed of the conductor layers 540, 548, 556, 563, 569, 574 and 583 and the inductor-forming portion 528a of the conductor layer 528.

The dielectric layer 209 has through holes h91, h92, h93 and h94 that are respectively connected to the through holes h81, h82, h83 and h84. The dielectric layer 209 has a number of through holes, as shown in FIG. 13, besides those indicated with numerals.

Figure 14:
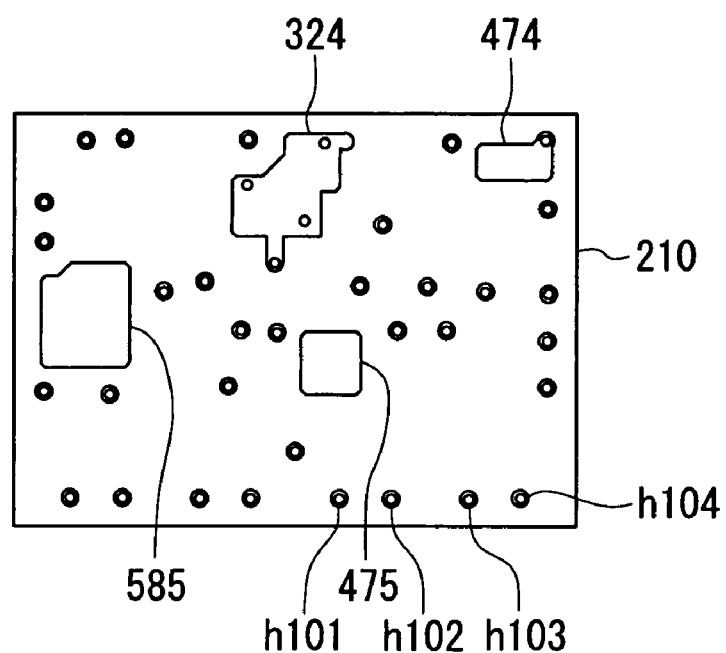
FIG. 14 is a top view illustrating a top surface of a tenth dielectric layer of the layered substrate of FIG. 3.

On the tenth dielectric layer 210 of FIG. 14, there are formed conductor layers 324, 474, 475 and 585 for capacitors. The conductor layer 324, together with the conductor layer 322 of FIG. 13, forms the capacitor 12 of FIG. 2. The conductor layer 471 of FIG. 13 is connected to the conductor layer 324 via a through hole formed in the dielectric layer 209. The conductor layer 304 of FIG. 6 is connected to the conductor layer 324 via through holes formed in the dielectric layers 202 to 209.

The conductor layer 474 forms part of the capacitor 33 of FIG. 2. The conductor layer 475 forms part of the capacitor 42 of FIG. 2. The conductor layer 465 of FIG. 12 is connected to the conductor layer 475 via through holes formed in the dielectric layers 208 and 209. The conductor layer 585 forms part of the capacitor 71 of FIG. 2. The conductor layer 585, together with the conductor layers 572 and 582, forms the capacitor 72 of FIG. 2. The conductor layer 572 of FIG. 12 is connected to the conductor layer 585 via through holes formed in the dielectric layers 208 and 209.

The dielectric layer 210 has through holes h101, h102, h103 and h104 that are respectively connected to the through holes h91, h92, h93 and h94. The dielectric layer 210 has a number of through holes, as shown in FIG. 14, besides those indicated with numerals.

Figure 15:
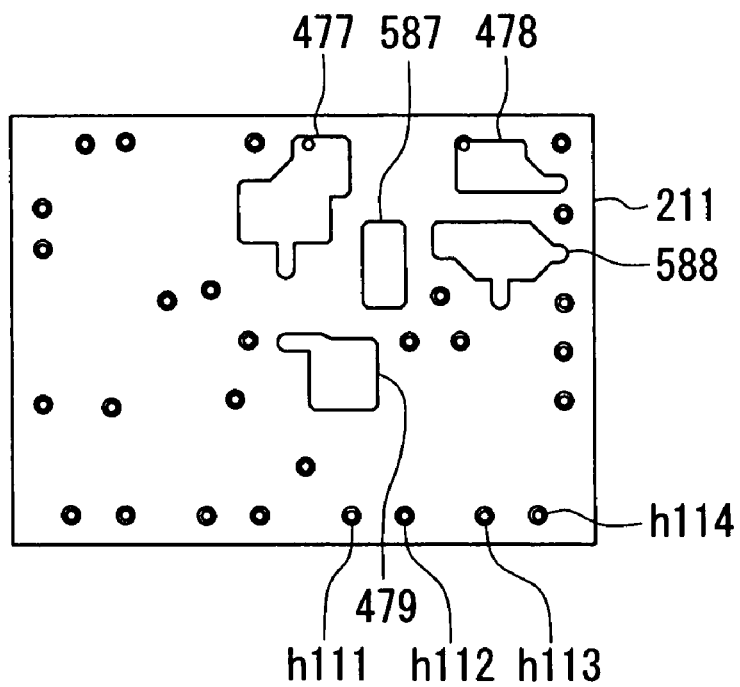
FIG. 15 is a top view illustrating a top surface of an eleventh dielectric layer of the layered substrate of FIG. 3.

On the eleventh dielectric layer 211 of FIG. 15, conductor layers 477 to 479, 587 and 588 for capacitors are formed. The conductor layer 477 forms part of the capacitor 24 of FIG. 2. The conductor layer 324 of FIG. 14 is connected to the conductor layer 477 via through holes formed in the dielectric layer 210. The conductor layer 478, together with the conductor layer 474 of FIG. 14, forms the capacitor 33 of FIG. 2, and forms part of the capacitor 32 of FIG. 2. The conductor layer 436 of FIG. 7 is connected to the conductor layer 478 via through holes formed in the dielectric layers 203 to 210. The conductor layer 479 forms part of the capacitor 41 of FIG. 2. The conductor layer 479, together with the conductor layers 456, 461, 472 and 475 and the capacitor-forming portion 465b of the conductor layer 465, forms the capacitor 42 of FIG. 2. The conductor layer 472 of FIG. 13 is connected to the conductor layer 479 via through holes formed in the dielectric layers 209 and 210.

The conductor layer 587 forms part of the capacitor 54 of FIG. 2. The conductor layer 571 of FIG. 12 is connected to the conductor layer 587 via through holes formed in the dielectric layers 208 to 210. The conductor layer 588 forms part of the capacitor 64 of FIG. 2. The conductor layer 588, together with the respective conductor layers 580 and 581, forms the capacitors 63 and 66 of FIG. 2. The conductor layer 538 of FIG. 7 is connected to the conductor layer 588 via through holes formed in the dielectric layers 203 to 210.

The dielectric layer 211 has through holes h111, h112, h113 and h114 that are respectively connected to the through holes h101, h102, h103 and h104. The dielectric layer 211 has a number of through holes, as shown in FIG. 15, besides those indicated with numerals.

Figure 16:
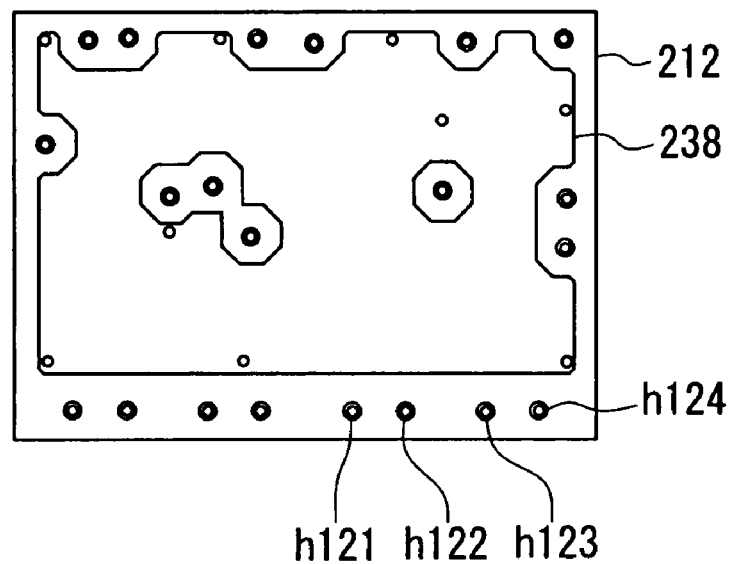
FIG. 16 is a top view illustrating a top surface of a twelfth dielectric layer of the layered substrate of FIG. 3.

On the twelfth dielectric layer 212 of FIG. 16, a conductor layer 238 for grounding is formed. The conductor layer 221 of FIG. 5 is connected to the conductor layer 238 via through holes formed in the dielectric layers 201 to 211. The conductor layers 227, 229 and 231 to 233 of FIG. 6 are connected to the conductor layer 238 via through holes formed in the dielectric layers 202 to 211. The conductor layers 235 and 236 of FIG. 7 are connected to the conductor layer 238 via through holes formed in the dielectric layers 203 to 211. The conductor layer 583 of FIG. 13 is connected to the conductor layer 238 via through holes formed in the dielectric layers 209 to 211. The conductor layer 238, together with the conductor layer 585 of FIG. 14, forms the capacitor 71 of FIG. 2. The conductor layer 238, together with the conductor layers 479, 587 and 588 of FIG. 15, forms the capacitors 41, 54 and 64 of FIG. 2, respectively.

The dielectric layer 212 has through holes h121, h122, h123 and h124 that are respectively connected to the through holes hill, h112, h113 and h114. The dielectric layer 212 has a number of through holes, as shown in FIG. 16, besides those indicated with numerals.

Figure 17:
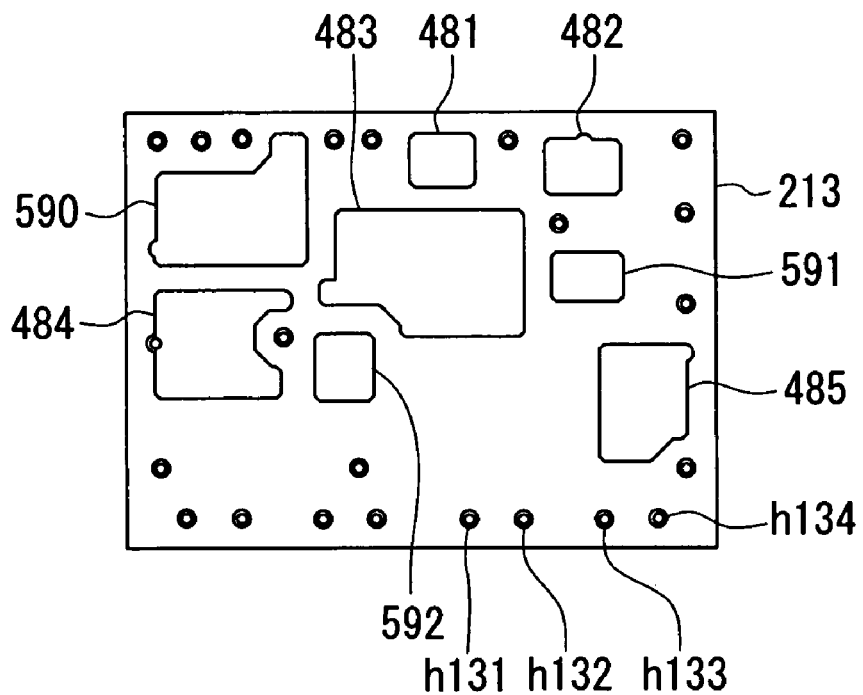
FIG. 17 is a top view illustrating a top surface of a thirteenth dielectric layer of the layered substrate of FIG. 3.

On the thirteenth dielectric layer 213 of FIG. 17, conductor layers 481 to 485 and 590 to 592 for capacitors are formed. The conductor layer 481 forms part of the capacitor 24 of FIG. 2. The conductor layer 477 of FIG. 15 is connected to the conductor layer 481 via through holes formed in the dielectric layers 211 and 212. The conductor layer 482 forms part of the capacitor 32 of FIG. 2. The conductor layer 478 of FIG. 15 is connected to the conductor layer 482 via through holes formed in the dielectric layers 211 and 212. The conductor layer 483 forms part of the capacitor 22 of FIG. 2. The conductor layer 427 of FIG. 6 is connected to the conductor layer 483 via through holes formed in the dielectric layers 202 to 212. The conductor layer 484 forms part of the capacitor 23 of FIG. 2. The conductor layer 428 of FIG. 6 is connected to the conductor layer 484 via through holes formed in the dielectric layers 202 to 212. The conductor layer 485 forms part of the capacitor 44 of FIG. 2. The conductor layer 443 of FIG. 8 is connected to the conductor layer 485 via through holes formed in the dielectric layers 204 to 212.

The conductor layer 590 forms part of the capacitor 52 of FIG. 2. The conductor layer 526 of FIG. 6 is connected to the conductor layer 590 via through holes formed in the dielectric layers 202 to 212. The conductor layer 591 forms part of the capacitor 62 of FIG. 2. The conductor layer 580 of FIG. 13 is connected to the conductor layer 591 via through holes formed in the dielectric layers 209 to 212. The conductor layer 592 forms part of the capacitor 74 of FIG. 2. The conductor layer 547 of FIG. 8 is connected to the conductor layer 592 via through holes formed in the dielectric layers 204 to 212.

The dielectric layer 213 has through holes h131, h132, h133 and h134 that are respectively connected to the through holes h121, h122, h123 and h124. The dielectric layer 213 has a number of through holes, as shown in FIG. 17, besides those indicated with numerals.

Figure 18:
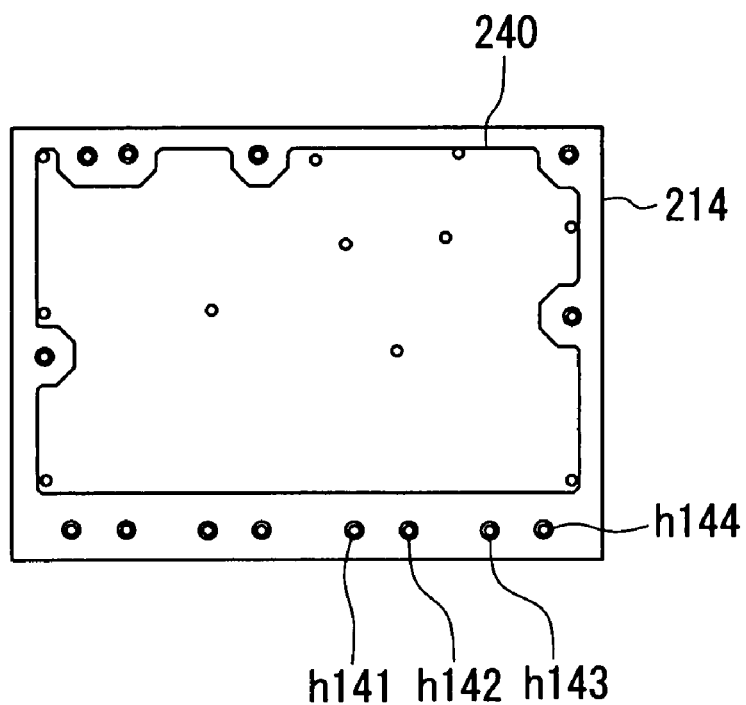
FIG. 18 is a top view illustrating a top surface of a fourteenth dielectric layer of the layered substrate of FIG. 3.

On the fourteenth dielectric layer 214 of FIG. 18, a conductor layer 240 for grounding is formed. The conductor layer 238 of FIG. 16 is connected to the conductor layer 240 via through holes formed in the dielectric layers 212 and 213. The capacitor 24 of FIG. 2 is formed of the conductor layers 477, 238, 481 and 240. The capacitor 32 of FIG. 2 is formed of the conductor layers 478, 238, 482 and 240. The capacitor 22 of FIG. 2 is formed of the conductor layers 238, 483 and 240. The capacitor 23 of FIG. 2 is formed of the conductor layers 238, 284 and 240. The capacitor 44 of FIG. 2 is formed of the conductor layers 238, 485 and 240. The capacitor 52 of FIG. 2 is formed of the conductor layers 238, 590 and 240. The capacitor 62 of FIG. 2 is formed of the conductor layers 238, 591 and 240. The capacitor 74 of FIG. 2 is formed of the conductor layers 238, 592 and 240.

The dielectric layer 214 has through holes h141, h142, h143 and h144 that are respectively connected to the through holes h131, h132, h133 and h134. The dielectric layer 214 has a number of through holes, as shown in FIG. 18, besides those indicated with numerals.

Figure 19:
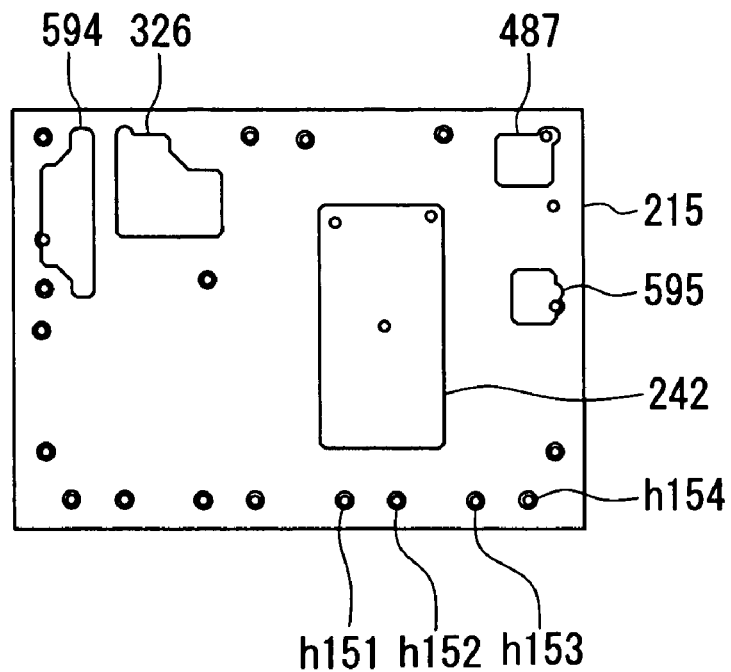
FIG. 19 is a top view illustrating a top surface of a fifteenth dielectric layer of the layered substrate of FIG. 3.

On the fifteenth dielectric layer 215 of FIG. 19, there are formed a conductor layer 242 for grounding and conductor layers 326, 487, 594 and 585 for capacitors. The conductor layer 240 of FIG. 18 is connected to the conductor layer 242 via through holes formed in the dielectric layer 214. The conductor layer 326 forms part of the capacitor 16 of FIG. 2. The conductor layer 319 of FIG. 11 is connected to the conductor layer 326 via through holes formed in the dielectric layers 207 to 214.

The conductor layer 487 forms part of the capacitor 34 of FIG. 2. The conductor layer 474 of FIG. 14 is connected to the conductor layer 487 via through holes formed in the dielectric layers 210 to 214. The conductor layer 594 forms part of the capacitor 53 of FIG. 2. The conductor layer 511 of FIG. 5 is connected to the conductor layer 594 via through holes formed in the dielectric layers 201 to 214. The conductor layer 595 forms part of the capacitor 67 of FIG. 2. The conductor layer 581 of FIG. 13 is connected to the conductor layer 595 via through holes formed in the dielectric layers 209 to 214.

The dielectric layer 215 has through holes h151, h152, h153 and h154 that are respectively connected to the through holes h141, h142, h143 and h144. The dielectric layer 215 has a number of through holes, as shown in FIG. 19, besides those indicated with numerals.

Figure 20:
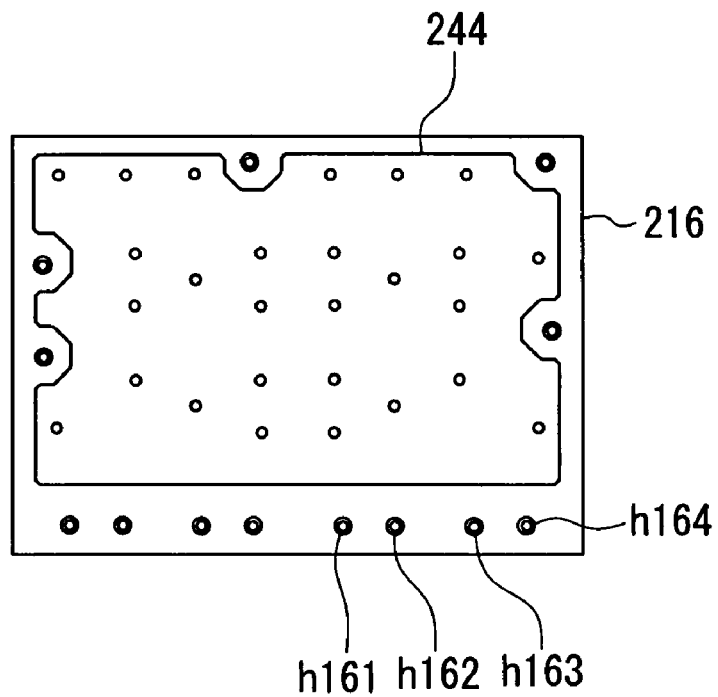
FIG. 20 is a top view illustrating a top surface of a sixteenth dielectric layer of the layered substrate of FIG. 3.
Figure 21:
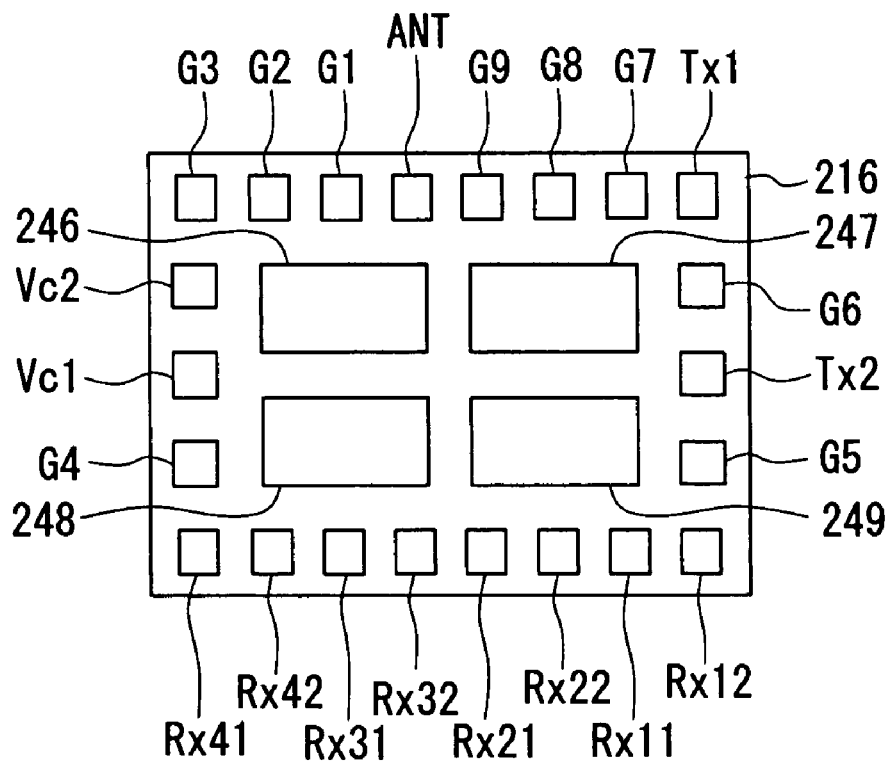
FIG. 21 is a top view illustrating the sixteenth dielectric layer and a conductor layer therebelow of the layered substrate of FIG. 3.

On the sixteenth dielectric layer 216 of FIG. 20, a conductor layer 244 for grounding is formed. The conductor layer 240 of FIG. 18 is connected to the conductor layer 244 via through holes formed in the dielectric layers 214 and 215. The conductor layer 242 of FIG. 19 is connected to the conductor layer 244 via through holes formed in the dielectric layer 215. The capacitor 16 of FIG. 2 is formed of the conductor layers 240, 326 and 244. The capacitor 34 of FIG. 2 is formed of the conductor layers 240, 487 and 244. The capacitor 53 of FIG. 2 is formed of the conductor layers 240, 594 and 244. The capacitor 67 of FIG. 2 is formed of the conductor layers 240, 595 and 244.

The dielectric layer 216 has through holes h161, h162, h163 and h164 that are respectively connected to the through holes h151, h152, h153 and h154. The dielectric layer 216 has a number of through holes, as shown in FIG. 20, besides those indicated with numerals.

As shown in FIG. 21, on the lower surface of the dielectric layer 216, that is, on the bottom surface of the layered substrate 200, there are formed: conductor layers forming the terminals ANT, Rx11, Rx12, Rx21, Rx22, Rx31,Rx32, Rx41, Rx42, Tx1, Tx2, Vc1 and Vc2 mentioned previously; conductor layers forming nine ground terminals G1 to G9; and conductor layers 246 to 249 for grounding. The ground terminals G1 to G9 are designed to be connected to the ground.

The conductor layer 322 of FIG. 13 is connected to the antenna terminal ANT via through holes formed in the dielectric layers 209 to 216. The conductor layer 468 of FIG. 12 is connected to the AGSM reception signal terminal Rx11 via the through holes h83, h93, h103, h113, h123, h133, h143, h153 and h163. The conductor layer 469 of FIG. 12 is connected to the AGSM reception signal terminal Rx12 via the through holes h84, h94, h104, h114, h124, h134, h144, h154 and h164. The conductor layer 466 of FIG. 12 is connected to the EGSM reception signal terminal Rx21 via the through holes h81, h91, h101, h111, h121, h131, h141, h151 and h161. The conductor layer 467 of FIG. 12 is connected to the EGSM reception signal terminal Rx22 via the through holes h82, h92, h102, h112, h122, h132, h142, h152 and h162.

The conductor layers 577 and 578 of FIG. 12 are connected to the DCS reception signal terminals Rx31 and Rx32 via through holes formed in the dielectric layers 208 to 216. The conductor layers 575 and 576 of FIG. 12 are connected to the PCS reception signal terminals Rx41 and Rx42 via through holes formed in the dielectric layers 208 to 216.

The conductor layer 487 of FIG. 19 is connected to the transmission signal terminal Tx1 via through holes formed in the dielectric layers 215 and 216. The conductor layer 595 of FIG. 19 is connected to the transmission signal terminal Tx2 via through holes formed in the dielectric layers 215 and 216. The conductor layer 484 of FIG. 17 is connected to the control terminal Vc1 via through holes formed in the dielectric layers 213 to 216. The conductor layer 594 of FIG. 19 is connected to the control terminal Vc2 via through holes formed in the dielectric layers 215 and 216. The conductor layer 244 of FIG. 20 is connected to the ground terminals G1 to G9 and the conductor layers 246 to 249 via through holes formed in the dielectric layer 216.

Figure 22:
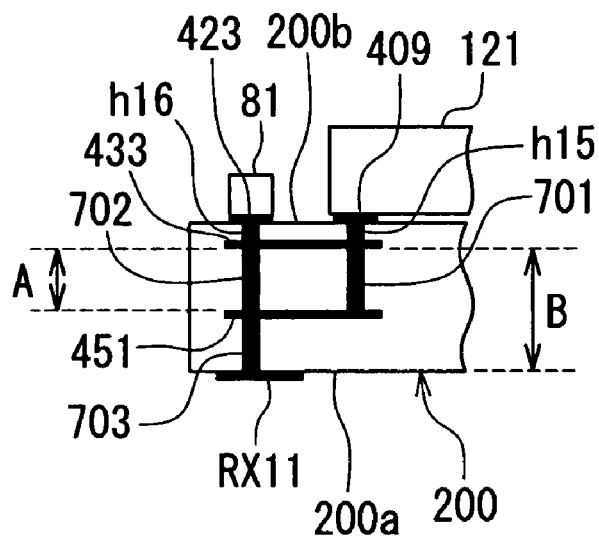
FIG. 22 is a view for schematically illustrating a signal transmission line of the high frequency module of the embodiment of the invention, the transmission line connecting a dual SAW filter, an inductor and a reception signal terminal to one another.

Reference is now made to FIG. 22 to describe features of the high frequency module 1 of the embodiment. FIG. 22 is a view for schematically illustrating a signal transmission line of the high frequency module 1, the transmission line connecting the dual SAW filter 121, the inductor 81 and the reception signal terminal Rx11 to one another. The following are descriptions of the configuration, function and effects of the signal transmission line connecting the dual SAW filter 121, the inductor 81 and the reception signal terminal Rx11 to one another. The configuration, function and effects of a signal transmission line connecting the dual SAW filter 121, the inductor 81 and the reception signal terminal Rx12 to one another are the same as those of the signal transmission line of FIG. 22, and so are the configuration, function and effects of each of a signal transmission line connecting the dual SAW filter 121, the inductor 82 and the reception signal terminal Rx21 to one another and a signal transmission line connecting the dual SAW filter 121, the inductor 82 and the reception signal terminal Rx22 to one another.

The signal transmission line of FIG. 22 incorporates: the conductor layer 409 disposed on the top surface 200b of the layered substrate 200, the dual SAW filter 121 being connected to the conductor layer 409; the conductor layer 423 disposed on the top surface 200b of the layered substrate 200, the inductor 81 being connected to the conductor layer 423; the conductor layer 433 located inside the layered substrate 200; the through hole h15 connecting the conductor layers 409 and 433 to each other; and the through hole h16 connecting the conductor layers 423 and 433 to each other.

The signal transmission line of FIG. 22 further incorporates: the conductor layer 451 disposed at a location closer to the bottom surface 200a of the layered substrate 200 than the conductor layer 433; two parallel signal paths 701 and 702 connecting the conductor layers 433 and 451 to each other; and a signal path 703 connecting the conductor layer 451 and the reception signal terminal Rx11 to each other.

The signal path 701 is formed using the through holes h25, h35 and h45 provided inside the layered substrate 200. The signal path 702 is formed using the through holes h26, h36 and h46 provided inside the layered substrate 200. The signal path 703 is formed using the through holes h53, h63 and h73, the conductor layer 468, and the through holes h83, h93, h103, h113, h123, h133, h143, h153 and h163 provided inside the layered substrate 200.

In the embodiment it suffices that each of the signal paths 701, 702 and 703 is formed using at least one of the through holes. In the embodiment such a configuration is possible that the conductor layer 451 is combined with the reception signal terminal Rx11 and that the signal path 703 is not provided. The signal paths 701 and 702 correspond to the plurality of parallel signal paths of the invention. The through holes included on the signal path 703 correspond to the 'at least one through hole for connecting the second conductor layer to the terminal' of the invention.

The dual SAW filter 121 and the inductor 81 correspond to the circuit components of the invention, and also correspond to the two elements mounted on the second surface of the layered substrate. In addition, the dual SAW filter 121 corresponds to the filter of the invention. The inductor 81 is an element for impedance matching between the dual SAW filter 121 and an external circuit connected to the reception signal terminal Rx11, and corresponds to the matching element of the invention. The reception signal terminal Rx11 corresponds to the terminal of the invention. The conductor layer 433 is provided for connecting the dual SAW filter 121 to the inductor 81, and corresponds to the first conductor layer of the invention. The conductor layer 451 corresponds to the second conductor layer of the invention.

In the high frequency module 1 of the embodiment, the reception signal terminal Rx11 is connected to each of the dual SAW filter 121 and the inductor 81 as a plurality of circuit components through the conductor layer 433, the parallel signal paths 701 and 702, and the conductor layer 451. According to the embodiment, the signal transmission line connecting the dual SAW filter 121, the inductor 81 and the reception signal terminal Rx11 to one another includes the plurality of parallel signal paths 701 and 702, so that it is possible to suppress the inductance of the signal transmission line. This feature will now be described in detail.

Figure 23:
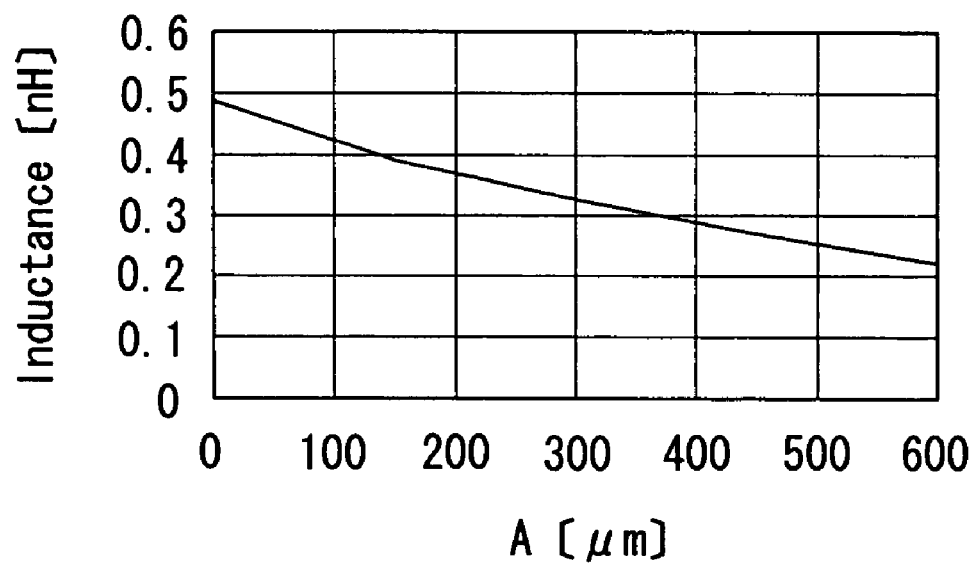
FIG. 23 is a plot showing a result of a simulation for describing an effect of the high frequency module of the embodiment of the invention.

The signal transmission line connecting the dual SAW filter 121, the inductor 81 and the reception signal terminal Rx11 to one another may have such a configuration that the reception signal terminal Rx11 and the conductor layer 433 of FIG. 22 is connected to each other through a single signal path formed using a plurality of through holes connected to one another in series. The signal transmission line having such a configuration will be hereinafter called a reference signal transmission line. The inductance of the signal transmission line shown in FIG. 22 is lower than that of the reference signal transmission line. This will now be described, referring to the results of a simulation. In this simulation, using a model of the signal transmission line of FIG. 22, the inductance of a portion of the signal transmission line between the conductor layer 433 and the reception signal terminal Rx11 was obtained. Here, as shown in FIG. 22, the distance between the conductor layers 433 and 451 taken in the direction in which the layers are stacked is defined as A (μm), and the distance between the conductor layer 433 and the reception signal terminal Rx11 taken in the direction in which the layers are stacked is defined as B (μm). The distance A is also the length of each of the signal paths 701 and 702 taken in the direction in which the layers are stacked. In the simulation, the relationship between the distance A and the above-mentioned inductance was obtained, where the distance B was taken as greater than 600 μm and the distance A was varied within a range of 0 to 600 μm. FIG. 23 shows the results. The case in which the distance A is 0 μm is such a case that the conductor layers 451 and 433 are combined, the parallel signal paths 701 and 702 are not provided, and the conductor layer 433 and the reception signal terminal Rx11 are connected to each other through a single signal path.

As shown in FIG. 23, the inductance decreases as the distance A increases. This teaches that, according to the embodiment, since the signal transmission line connecting the dual SAW filter 121, the inductor 81 and the reception signal terminal Rx11 to one another includes the plurality of parallel signal paths 701 and 702, it is possible to suppress the inductance of the signal transmission line.

As thus described, according to the embodiment, it is possible to suppress the inductance of the signal transmission line, so that it is possible to suppress variations in characteristics of the high frequency module 1 resulting from the inductance of the signal transmission line.

In the embodiment the dual SAW filter 121 and the inductor 81 are elements mounted on the layered substrate 200. Therefore, the dual SAW filter 121 and the inductor 81 are designed in advance so that the impedance matching is obtained between each of the dual SAW filter 121 and the inductor 81 and an external circuit connected thereto through the reception signal terminal Rx11. According to the embodiment, it is possible to suppress the inductance of the signal transmission line connecting the dual SAW filter 121, the inductor 81 and the reception signal terminal Rx11 to one another, so that it is possible to prevent a failure to match the impedance between each of the dual SAW filter 121 and the inductor 81 and an external circuit.

According to the embodiment, as shown in FIG. 23, it is possible to adjust the inductance of the signal transmission line including the parallel signal paths 701 and 702 by changing the length of each of the signal paths 701 and 702 when designing the layered substrate 200. As a result, it is easy to adjust the characteristics of the high frequency module 1.

Figure 24:
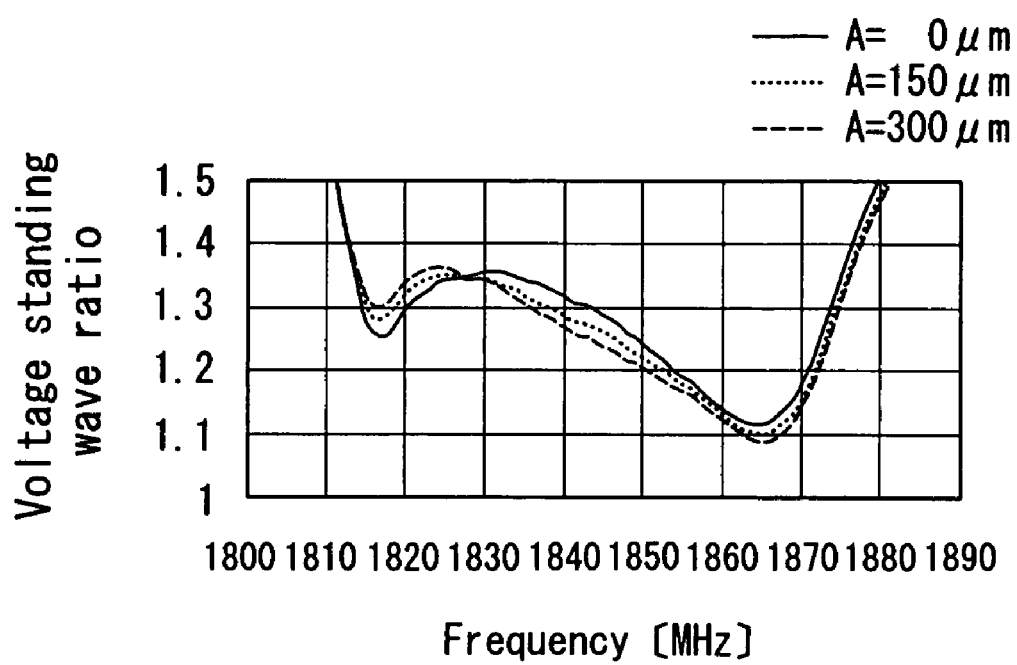
FIG. 24 is a plot showing a result of another simulation for describing an effect of the high frequency module of the embodiment of the invention.

FIG. 24 shows the results of a simulation performed to determine the frequency characteristics of voltage standing wave ratio (VSWR) between the dual SAW filter 121 and the reception signal terminal Rx11 when the distance A of FIG. 22 was varied. In the simulation the frequency characteristics of the voltage standing wave ratio were determined for the cases where the distance A was 0 μm, 150 μm, and 300 μm. FIG. 24 indicates that, according to the embodiment, it is possible to control the voltage standing wave ratio by changing the distance A. It is therefore easy to adjust the characteristics of the high frequency module 1.

In the embodiment the conductor layer 433 has both the function of connecting the dual SAW filter 121 and the inductor 81 as a plurality of circuit components to each other and the function of connecting the parallel signal paths 701 and 702 to each other. Therefore, according to the embodiment, it is possible to form the signal transmission line that includes the parallel signal paths 701 and 702 and that connects the dual SAW filter 121, the inductor 81 and the reception signal terminal Rx11 to one another without wasting a space inside the layered substrate 200. As a result, according to the embodiment, it is possible to reduce the insertion loss of the high frequency module 1 and to reduce the parasitic capacitance or parasitic inductance resulting from the signal transmission line, and it is also possible to reduce the high frequency module 1 in dimensions.

The present invention is not limited to the foregoing embodiment but may be practiced in still other ways. For example, in the invention, a plurality of circuit components connected through the first conductor layer are not limited to a plurality of elements mounted on the second surface of the layered substrate but may be a plurality of circuit components provided inside the layered substrate. The circuit components may be passive elements or active elements.

In the invention, the number of circuit components connected through the first conductor layer may be three or more. The number of parallel signal paths connecting the first and second conductor layers to each other may also be three or more.

The invention is applicable not only to high frequency modules that are used as front-end modules incorporated in cellular phones but also to high frequency modules in general each of which incorporates a layered substrate and a signal transmission line connecting a plurality of circuit components to terminals to each other.

Obviously many modifications and variations of the present invention are possible in the light of the above teachings. It is therefore to be understood that within the scope of the appended claims the invention may be practiced otherwise than as specifically described.

What is claimed is:

1. A high frequency module comprising a layered substrate, the layered substrate including: a plurality of dielectric layers and a plurality of conductor layers that are alternately stacked; a first surface and a second surface located at both sides of the layered substrate, the sides being opposed to each other in a direction in which the layers are stacked; and a terminal disposed on the first surface, wherein:

the plurality of conductor layers include: a first conductor layer for connecting a plurality of circuit components to each other; and a second conductor layer connected to the terminal and disposed at a location closer to the first surface than the first conductor layer; and the layered substrate further includes a plurality of parallel signal paths each of which is formed using at least one through hole provided inside the layered substrate and each of which connects the first and second conductor layers to each other.

2. The high frequency module according to claim 1, further comprising a plurality of elements mounted on the second surface as the plurality of circuit components, wherein the first conductor layer connects the plurality of elements to each other.

3. The high frequency module according to claim 1, wherein the layered substrate further includes at least one through hole for connecting the second conductor layer to the terminal.

4. A high frequency module comprising:

an antenna terminal connected to an antenna;

a reception signal terminal outputting reception signals;

a transmission signal terminal receiving transmission signals;

a separation circuit disposed between the antenna terminal and the reception and transmission signal terminals, and separating the reception signals and the transmission signals from each other;

a filter provided between the separation circuit and the reception signal terminal;

a matching element for impedance matching between the filter and an external circuit connected to the reception signal terminal, the matching element being connected to the filter and the reception signal terminal; and a layered substrate integrating the foregoing components, wherein:

the layered substrate includes a plurality of dielectric layers and a plurality of conductor layers that are alternately stacked; and a first surface and a second surface located at both sides of the layered substrate, the sides being opposed to each other in a direction in which the layers are stacked;

the reception signal terminal is disposed on the first surface;

the filter and the matching element are mounted on the second surface;

the plurality of conductor layers include: a first conductor layer for connecting the filter and the matching element to each other; and a second conductor layer connected to the reception signal terminal and disposed at a location closer to the first surface than the first conductor layer; and the layered substrate further includes a plurality of parallel signal paths each of which is formed using at least one through hole provided inside the layered substrate and each of which connects the first and second conductor layers to each other.

5. The high frequency module according to claim 4, wherein the filter is formed using an acoustic wave element.

6. The high frequency module according to claim 4, wherein the layered substrate further includes at least one through hole for connecting the second conductor layer to the reception signal terminal.

* * * * *